(12) United States Patent
Lee et al.

(10) Patent No.: US 11,825,715 B2
(45) Date of Patent: *Nov. 21, 2023

(54) DISPLAY DEVICE

(71) Applicant: SAMSUNG DISPLAY CO., LTD., Yongin-si (KR)

(72) Inventors: Haeyeon Lee, Yongin-si (KR); Hyunchol Bang, Yongin-si (KR); Chulkyu Kang, Yongin-si (KR); Sujin Kim, Yongin-si (KR); Bongwon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/148,371

(22) Filed: Dec. 29, 2022

(65) Prior Publication Data

US 2023/0140561 A1    May 4, 2023

Related U.S. Application Data

(63) Continuation of application No. 17/137,071, filed on Dec. 29, 2020, now Pat. No. 11,545,537.

(30) Foreign Application Priority Data

Jun. 15, 2020  (KR) ........................ 10-2020-0072608

(51) Int. Cl.
*H10K 59/131*     (2023.01)
*H10K 59/88*     (2023.01)
(Continued)

(52) U.S. Cl.
CPC ......... *H10K 59/131* (2023.02); *H10K 59/124* (2023.02); *H10K 59/1213* (2023.02); *H10K 59/88* (2023.02)

(58) Field of Classification Search
CPC ......... G09G 3/3225; G09G 2300/0413; G09G 2300/0426; H10K 59/1213; H10K 59/88; H10K 59/124
See application file for complete search history.

(56) References Cited

U.S. PATENT DOCUMENTS 8,637,894 B2    1/2014  Lee et al.
10,615,229 B2    4/2020  Lee et al.
(Continued)

FOREIGN PATENT DOCUMENTS

KR    10-2014-0068421 A    6/2014
KR    10-1764272 B1    8/2017
(Continued)

*Primary Examiner* — Kevin M Nguyen
(74) *Attorney, Agent, or Firm* — Lewis Roca Rothgerber Christie LLP

(57) ABSTRACT

A display device includes: a substrate including a display area, and a peripheral area outside the display area, the display area including a first area and a second area; a data line at the display area; a pad area at the peripheral area; a connection line at the first area, and connected to the data line to transmit a data signal supplied from the pad area to the data line; a voltage line on the substrate; and a dummy line at the second area, and connected to the voltage line, the dummy line including a plurality of horizontal dummy patterns and a plurality of vertical dummy patterns that are alternately connected to one another.

20 Claims, 13 Drawing Sheets

(51) Int. Cl.
*H10K 59/124* (2023.01)
*H10K 59/121* (2023.01)

(56) References Cited

U.S. PATENT DOCUMENTS

| | | | |
|---|---|---|---|
| 11,545,537 B2 * | 1/2023 | Lee | ............ H10K 59/124 |
| 2014/0319528 A1 | 10/2014 | Kesho et al. | |
| 2019/0181213 A1 | 6/2019 | Lim | |

FOREIGN PATENT DOCUMENTS

| | | |
|---|---|---|
| KR | 10-2018-0011914 A | 2/2018 |
| KR | 10-1830611 B1 | 2/2018 |
| KR | 10-2018-0049005 A | 5/2018 |
| WO | WO 2017/127563 A1 | 7/2017 |

* cited by examiner

DISPLAY DEVICE

CROSS-REFERENCE TO RELATED APPLICATIONS

This application is a continuation of U.S. patent application Ser. No. 17/137,071, filed Dec. 29, 2020, which claims priority to and the benefit of Korean Patent Application No. 10-2020-0072608, filed Jun. 15, 2020, the entire content of both of which is incorporated herein by reference.

BACKGROUND

1. Field

Aspects of one or more example embodiments relate to a display apparatus.

2. Description of Related Art

A display device visually displays data. A display device may be used as a display in a small-sized product such as a mobile phone, or a display in a large-sized product such as a television.

A display device includes a plurality of pixels that emit light by receiving electrical signals in order to externally display images. Each of the pixels includes a light-emitting element. For example, an organic light-emitting display device includes an organic light-emitting diode as the light-emitting element. In general, in the organic light-emitting display device, thin-film transistors and organic light-emitting diodes are arranged on a substrate, and the organic light-emitting diodes are self-emitting elements (e.g., emit light by themselves).

Recently, usages of a display device have increased, and various designs for improving quality of a display device have been attempted. In particular, various display devices having excellent characteristics, such as being thin, light weight, and having low power consumption, have been introduced. In addition, in recent years, dead spaces of display devices have decreased, and sizes of display areas of the display devices are expanding.

The above information disclosed in this Background section is for enhancement of understanding of the background of the present disclosure, and therefore, it may contain information that does not constitute prior art.

SUMMARY

One or more example embodiments of the present disclosure are directed to a display device for reducing a dead space and for preventing or reducing pattern visibility at (e.g., in or on) a display area.

However, the aspects and features of the present disclosure are not limited to those above, and other aspects and features may be clearly understood by those skilled in the art from the description of the present disclosure.

Additional aspects and features will be set forth, in part, in the description which follows, and in part, will be apparent from the description, or may be learned by practicing one or more of the presented embodiments of the present disclosure.

According to one or more example embodiments of the present disclosure, a display device includes: a substrate including a display area, and a peripheral area outside the display area, the display area including a first area and a second area; a data line at the display area; a pad area at the peripheral area; a connection line at the first area, and connected to the data line to transmit a data signal supplied from the pad area to the data line; a voltage line on the substrate; and a dummy line at the second area, and connected to the voltage line, the dummy line including a plurality of horizontal dummy patterns and a plurality of vertical dummy patterns that are alternately connected to one another.

In an example embodiment, the plurality of horizontal dummy patterns and the plurality of vertical dummy patterns may be at different layers from one another.

In an example embodiment, the connection line may include a plurality of horizontal connection patterns and a plurality of vertical connection patterns that are alternately connected to one another.

In an example embodiment, one side of a first horizontal connection pattern from among the plurality of horizontal connection patterns may be connected to a first vertical connection pattern extending in a first direction from among the plurality of vertical connection patterns, and another side of the first horizontal connection pattern may be connected to a second vertical connection pattern extending in a second direction opposite to the first direction from among the plurality of vertical connection patterns.

In an example embodiment, the plurality of horizontal connection patterns and the plurality of vertical connection patterns may be at different layers from one another.

In an example embodiment, the plurality of horizontal dummy patterns and the plurality of horizontal connection patterns may be at a same layer as each other, and the plurality of vertical dummy patterns and the plurality of vertical connection patterns may be at a same layer as each other.

In an example embodiment, the voltage line may include a first voltage line, and a second voltage line crossing the first voltage line, and the dummy line may be connected to at least one of the first voltage line or the second voltage line.

In an example embodiment, the dummy line may be connected to the voltage line through at least two contact holes that are spaced from each other.

In an example embodiment, the first voltage line and the second voltage line may be at different layers from each other.

In an example embodiment, the display device may further include an insulating layer between the dummy line and the first voltage line, and the dummy line may be connected to the first voltage line through a contact hole defined in the insulating layer.

In an example embodiment, the dummy line may include an extension line extending toward the second voltage line and contacting the second voltage line.

In an example embodiment, the display device may further include a first thin-film transistor including a first semiconductor layer, and a first gate electrode at least partially overlapping with the first semiconductor layer, and the voltage line may be electrically connected to the first thin-film transistor.

In an example embodiment, the display device may further include a second thin-film transistor including a second semiconductor layer, and a second gate electrode at least partially overlapping the second semiconductor layer, and the second semiconductor layer may include an oxide semiconductor material.

According to one or more example embodiments of the present disclosure, a display device includes: a substrate including a display area, and a peripheral area outside the display area, the display area including a first area and a second area; a data line at the display area; a pad area at the peripheral area; a connection line at the first area, and connected to the data line to transmit a data signal supplied from the pad area to the data line, the connection line including a plurality of horizontal connection patterns and a plurality of vertical connection patterns that are alternately connected to one another; a voltage line on the substrate; and a dummy line at the second area, and connected to the voltage line.

In an example embodiment, the plurality of horizontal connection patterns and the plurality of vertical connection patterns may be at different layers from one another.

In an example embodiment, the dummy line may have a shape that is bent at least twice in a plan view.

In an example embodiment, the dummy line may include a plurality of horizontal dummy patterns and a plurality of vertical dummy patterns that are alternately connected to one another.

In an example embodiment, the voltage line may include a first voltage line and a second voltage line, the second voltage line may be at a different layer from that of the first voltage line and crossing the first voltage line, and the dummy line may be connected to at least one of the first voltage line or the second voltage line.

In an example embodiment, display device may further include an insulating layer between the dummy line and the first voltage line, and the dummy line may be connected to the first voltage line through a contact hole defined in the insulating layer.

In an example embodiment, the dummy line may include an extension line extending toward the second voltage line, and contacting the second voltage line.

BRIEF DESCRIPTION OF THE DRAWINGS

The above and other aspects and features of the present disclosure will be more clearly understood from the following detailed description of the illustrative, non-limiting example embodiments with reference to the accompanying drawings, in which.

DETAILED DESCRIPTION

Figure 1:
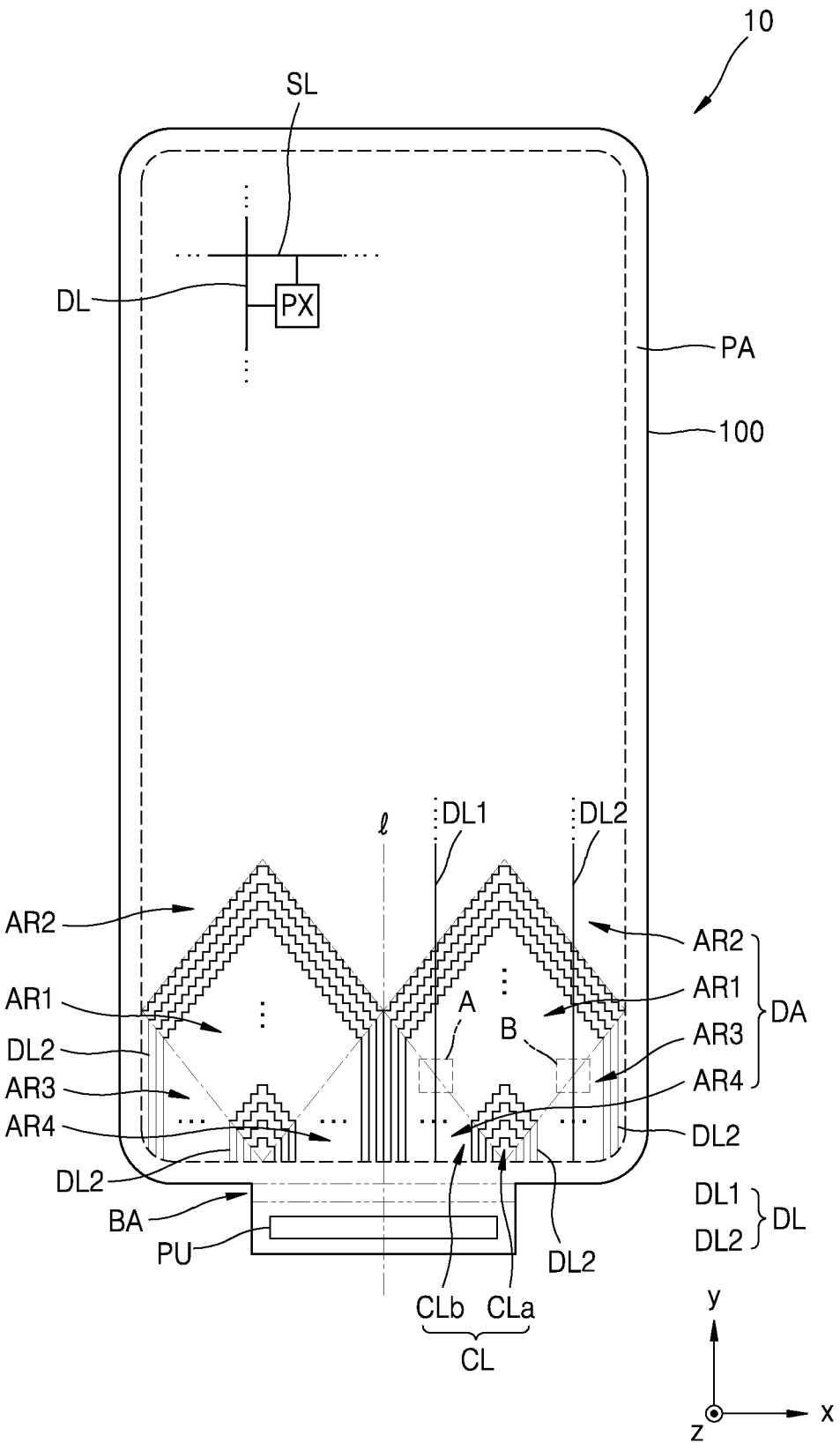
FIG. 1 is a schematic plan view showing an example of a display panel according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, region, or component is referred to as being "formed on," another layer, region, or component, it may be directly formed on the other layer, region, or component, or one or more intervening layers, regions, or components may be present. In addition, it will also be understood that when an element or layer is referred to as being "between" two elements or layers, it can be the only element or layer between the two elements or layers, or one or more intervening elements or layers may also be present.

When a certain embodiment may be implemented differently, a specific process order may be performed differently from the described order. For example, two consecutively described processes may be performed substantially at the same time or performed in an order opposite to the described order.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the phrase "A and/or B" denotes A, B, or A and B. Expressions such as "at least one of," when preceding a list of elements, modify the entire list of elements and do not modify the individual elements of the list. For example, the expression "at least one of a, b or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
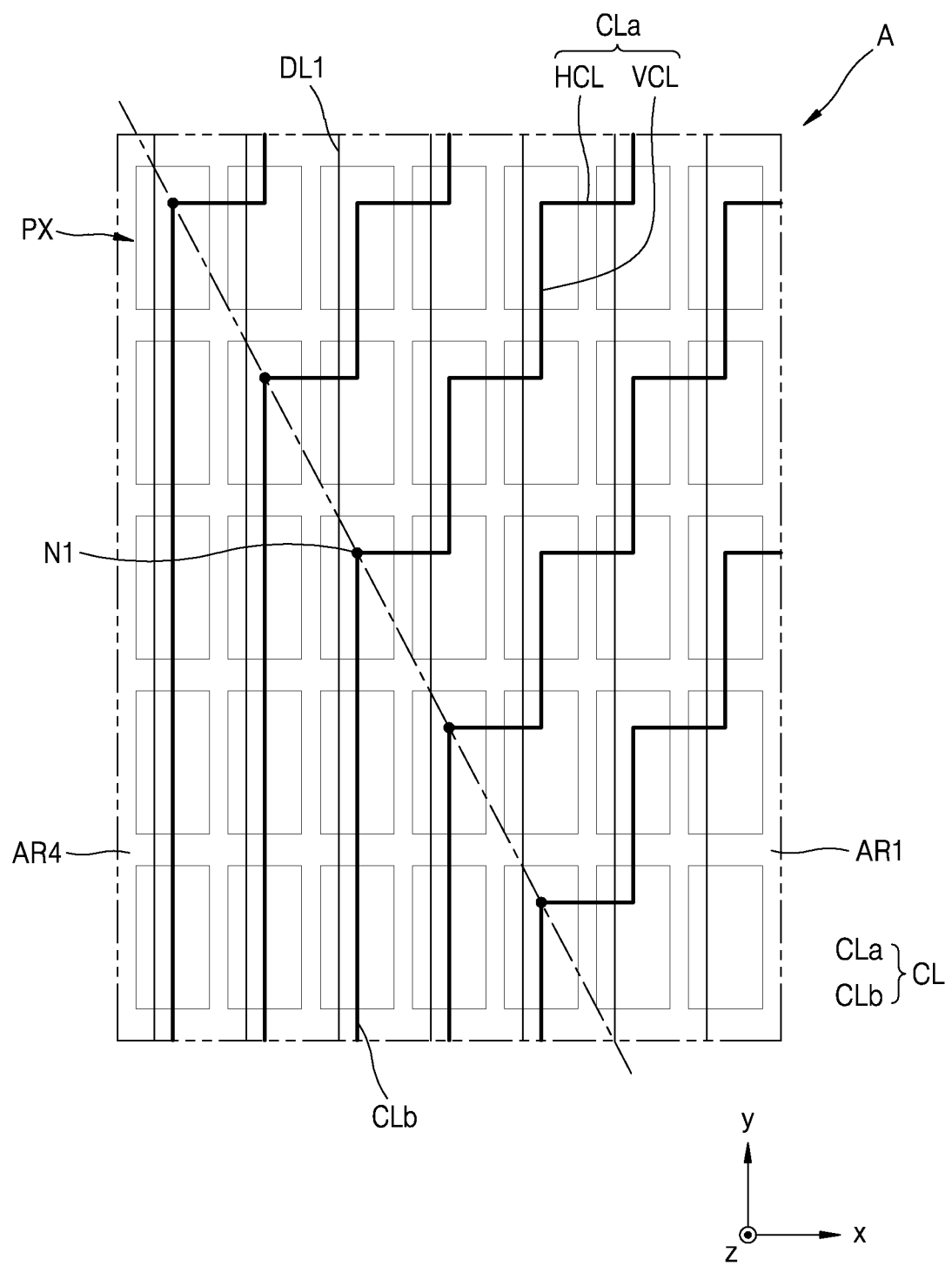
FIG. 2 is an enlarged plan view showing the portion A of FIG. 1.
Figure 3:
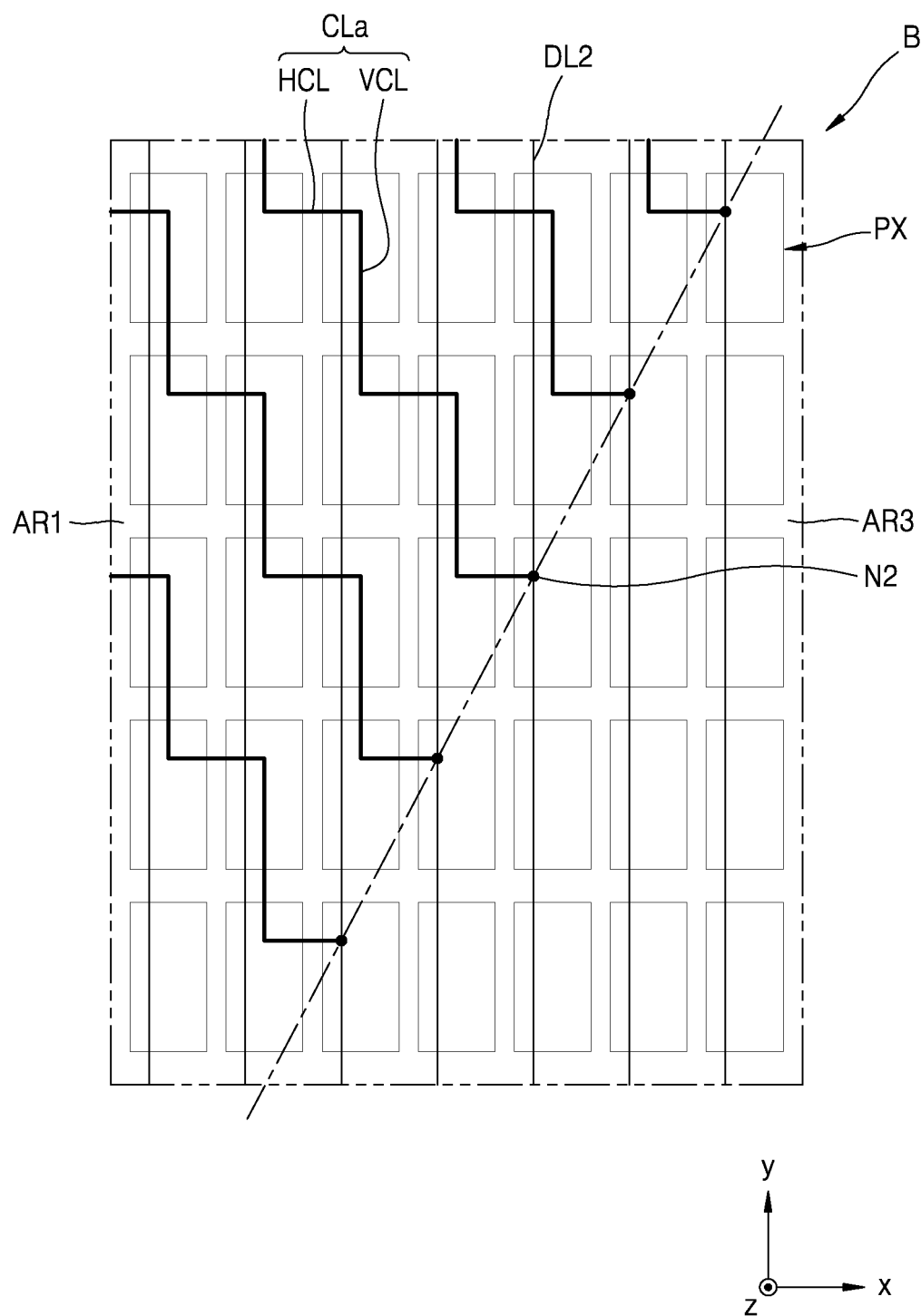
FIG. 3 is an enlarged plan view showing the portion B of FIG. 1.

FIG. 1 is a schematic plan view showing an example of a display panel according to an embodiment. FIG. 2 is an enlarged plan view showing the portion A of FIG. 1, and FIG. 3 is an enlarged plan view showing the portion B of FIG. 1.

Referring to FIG. 1, a display device may include a display panel 10 including a substrate 100. The display panel 10 may have a display area DA and a peripheral area PA located outside the display area DA. For example, the peripheral area PA may surround or may partially surround (e.g., around a periphery of) the display area DA. The substrate 100 may have a display area DA and a peripheral area PA corresponding to the display area DA and the peripheral area PA, respectively, of the display panel 10.

The substrate 100 may include at least one of various suitable materials, for example, such as glass, metal, and plastic. According to an embodiment, the substrate 100 may include a flexible material. The flexible material refers to a substrate that may be easily warped, bent, folded, or rolled. The substrate 100 including the flexible material may include, for example, ultra-thin glass, metal, or plastic.

A plurality of pixels PX including various display elements, for example, such as an organic light-emitting diode (OLED), may be arranged at (e.g., in or on) the display area DA of the substrate 100. The plurality of pixels PX may be provided at (e.g., in or on) the display area DA, and may be arranged in various suitable forms, for example, such as a stripe arrangement, a pentile arrangement, a mosaic arrangement, and/or the like, to implement an image.

When the display area DA is viewed on a plane that is parallel to or substantially parallel to a top surface of the display panel 10 (e.g., in a plan view), the display area DA may have a rectangular shape, as shown in FIG. 1. In another embodiment, the display area DA may have any suitable polygonal shape, for example, such as a triangular shape, a pentagonal shape, a hexagonal shape, and/or the like, or may have a circular shape, an elliptical shape, an irregular shape, and/or the like.

The peripheral area PA may surround (e.g., around a periphery of) the display area DA. The peripheral area PA is an area in which the pixels PX are not arranged. Various wiring lines that deliver electrical signals to be applied to the display area DA, and a pad unit (e.g., a pad area) PU including a plurality of pads to which a printed circuit board or a driver integrated circuit (IC) chip is attached, may be located at (e.g., in or on) the peripheral area PA. The plurality of pads may be electrically connected to a data driver. In an embodiment, a data driver that supplies a data signal may be arranged on a film electrically connected to pads of the pad unit PU in a chip on film (COF) method. According to another embodiment, the data driver may be directly arranged on the substrate 100 in a chip on glass (COG) or a chip on plastic (COP) method.

FIG. 1 illustrates a plan view showing a state of the substrate 100 during a process of manufacturing the display device. In an electronic device such as a final display device or a smartphone including a display device, a portion of the substrate 100 may be bent to reduce the area of the peripheral area PA that may be recognized by a user (or a viewer).

As shown in FIG. 1, the peripheral area PA may include a bending area BA, and the bending area BA may be located between the pad unit PU and the display area DA. In this case, the substrate 100 may be bent in the bending area BA, and thus, at least a portion of the pad unit PU may overlap with the display area DA (e.g., at a rear surface of the display panel 10). In other words, the pad unit PU may not cover the display area DA, and a bending direction is set such that the pad unit PU is located behind (e.g., at the rear surface of) the display area DA when the bending area BA is bent. Accordingly, a user recognizes that the display area DA occupies most of (e.g., a majority of) the display device.

The plurality of pixels PX and various signal lines capable of applying electrical signals to the plurality of pixels PX may be located at (e.g., in or on) the display area DA.

Each of the plurality of pixels PX may include a display element, and a pixel circuit for driving the display element. As an example, the display element may be an OLED, and the pixel circuit may include a plurality of thin-film transistors, a storage capacitor, and the like. The plurality of pixels PXs may include first pixels for emitting light of a first color, second pixels for emitting light of a second color, and third pixels for emitting light of a third color. For example, the first pixels may be red pixels (R), the second pixels may be green pixels (G), and the third pixels may be blue pixels (B), but the present disclosure is not limited thereto.

The signal lines, which may be capable of applying electrical signals to the plurality of pixels PX, may include a plurality of scan lines SL, a plurality of data lines DL, and the like. Each of the plurality of data lines DL may extend in a first direction (e.g., a y direction), and each of the plurality of scan lines SL may extend in a second direction (e.g., an x direction). The plurality of scan lines SL may be arranged, for example, in a plurality of rows (e.g., along the y direction) to transmit scan signals to the pixels PX, and the plurality of data lines DL may be arranged, for example, in a plurality of columns (e.g., along the x direction) to transmit data signals to the pixels PX. Each of the plurality of pixels PX may be connected to at least one corresponding scan line SL from among the plurality of scan lines SL and a corresponding data line DL from among the plurality of data lines DL.

As shown in FIGS. 2 and 3, the plurality of data lines DL may include a plurality of first data lines DL1 and a plurality of second data lines DL2. The plurality of second data lines DL2 may be data lines DL connected to a plurality of connection lines CL, respectively, which will be described in more detail below. The plurality of first data lines DL1 may be data lines DL other than the plurality of second data lines DL2.

At (e.g., in or on) the display area DA, the plurality of connection lines CL may be arranged. The plurality of connection lines may transmit electrical signals supplied from the pad unit PU to the signal lines connected to the pixels PX. For example, the plurality of connection lines CL may be connected to the plurality of second data lines DL2, respectively, to transmit data signals supplied from the pads of the pad unit PU to the plurality of second data lines DL2. In this case, the area of the peripheral area PA may be reduced when compared to a case where fan-out wiring lines are located at (e.g., in or on) the peripheral area PA, and thus, the dead space of the display panel 10 may be reduced.

As shown in FIG. 1, a plurality of connection lines CL arranged on the left side of a first line ℓ (e.g., a virtual line) passing through or approximately passing through the center of the display panel 10 in the second direction (e.g., the x direction) and a plurality of connection lines CL arranged on the right side of the first line ℓ may be symmetrical or substantially symmetrical (e.g., approximately left-right symmetrical) with each other relative to the first line ℓ.

Hereinafter, the plurality of connection lines CL arranged on the right side of the first line ℓ may be described in more detail, and the description thereof may be equally or substantially equally applied to the plurality of connection lines CL arranged on the left side of the first line ℓ.

Each of the plurality of connection lines CL may include a first portion CLa and a second portion CLb.

The first portion CLa of each of the plurality of connection lines CL may have a shape that is bent at least twice, for example, as shown in FIG. 2. The first portion CLa may include a plurality of horizontal connection patterns HCL and a plurality of vertical connection patterns VCL, which are alternately connected to one another. The plurality of horizontal connection patterns HCL may be spaced apart from each other by at least one row interval. The plurality of vertical connection patterns VCL may be spaced apart from each other by at least one column interval. The plurality of horizontal connection patterns HCL and the plurality of vertical connection patterns VCL may be arranged on different layers from one another.

As described above, when the first portion CLa of each of the plurality of connection lines CL has a stepwise shape that is bent at least twice, a smudge appearing at the boundary between the first portion CLa and the second portion CLb when the display panel 10 is driven may be reduced or prevented. In other words, a phenomenon in which the boundary between the first portion CLa and the second portion CLb becomes blurred (e.g., or uneven) may be reduced or prevented.

The second portion CLb of each of the plurality of connection lines CL may be arranged on a side of the first line ℓ. The second portion CLb may extend away from the pad unit PU in the first direction (e.g., the y direction). Referring to FIG. 2, the second portion CLb of each of the connection lines CL may be parallel to or substantially parallel to a first data line DL1, and may be adjacent to the first data line DL1. The second portion CLb of each of the connection lines CL may extend parallel to or substantially parallel to the first data line DL1 arranged in one column of the plurality of columns. The second portions CLb of a pair of connection lines CL that are adjacent to each other may be spaced apart from each other by at least one column interval.

Each of the connection lines CL may have one end connected to a second data line DL2 and another end connected to a corresponding pad of the pad unit PU. The other end of each of the connection lines CL may be connected to a corresponding pad of the pad unit PU through a separate bridge wiring line. In an embodiment, the bridge wiring line may be a portion in which the second portion CLb of the connection line CL extends to the peripheral area PA. In another embodiment, the bridge wiring line may be a separate wiring line arranged on a different layer from that of the connection line CL, and may be electrically connected to the second portion CLb of the connection line CL at (e.g., in or on) the peripheral area PA.

The second portion CLb of the connection line CL extending in the first direction (e.g., the y direction) may be connected to the first portion CLa of the connection line CL at a first node N1. In more detail, the second portion CLb may be connected to the horizontal connection pattern HCL of the first portion CLa at the first node N1.

The first portion CLa may extend toward the peripheral area PA, as the plurality of horizontal connection patterns HCL and the plurality of vertical connection patterns VCL are connected to one another in a stepwise manner. The first portion CLa extending toward the peripheral area PA may be connected to the second data line DL2 at a second node N2. Accordingly, the plurality of connection lines CL may be connected to the plurality of second data lines DL2, respectively, and the plurality of connection lines CL may transmit data signals supplied from the pads of the pad unit PU to the plurality of second data lines DL2.

The display area DA may be divided into a plurality of areas according to where the connection lines CL are arranged. For example, the display area DA may include a first area AR1 and a fourth area AR4 at (e.g., in or on) which the connection lines CL are arranged, and a second area AR2 and a third area AR3 at (e.g., in or on) which the connection lines CL are not located. For example, each of the first portions CLa of the connection lines CL may be connected to a corresponding second data line DL2 extending through the third area AR3, and thus, the third area AR3 may not include the second portions CLb of the connection lines CL.

The first area AR1 and the fourth area AR4 may be areas obtained by dividing the display panel 10 according to a direction in which the connection lines CL extend. For example, the first area AR1 may be an area at (e.g., in or on) which the first portions CLa of the connection lines CL are arranged, and the fourth area AR4 may be an area at (e.g., in or on) which the second portions CLb of the connection lines CL are arranged. The first area AR1 and the fourth area AR4 located on the left side of the first line ℓ may be symmetrical or substantially symmetrical (e.g., approximately symmetrical) with the first area AR1 and the fourth area AR4 located on the right side of the first line ℓ, respectively.

Figure 4:
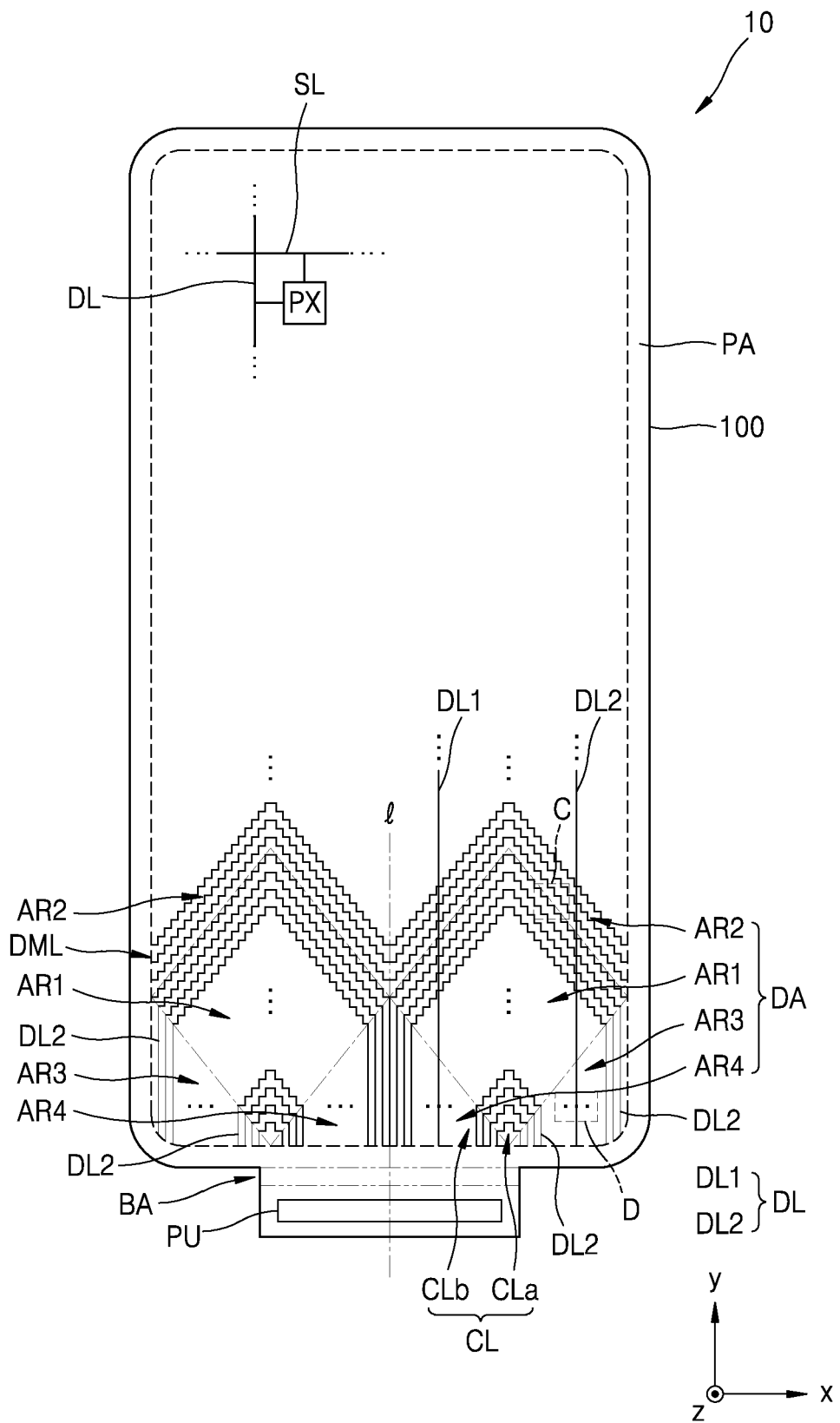
FIG. 4 is a schematic plan view showing an example of a display panel according to an embodiment.

FIG. 4 is a schematic plan view showing an example of a display panel according to an embodiment. In FIG. 4, the same reference numerals as those in FIG. 1 denote the same or substantially the same elements as those in FIG. 1, and thus, redundant descriptions thereof may not be repeated.

Referring to FIG. 4, a plurality of dummy lines DML may be arranged at (e.g., in or on) the second area AR2 of the display area DA of the display panel 10. Although not shown in FIG. 4, a plurality of dummy lines DML may also be arranged at (e.g., in or on) the third area AR3 of the display area DA.

The plurality of dummy lines DML may have the same or substantially the same shape as that of the plurality of connection lines CL arranged at (e.g., in or on) the first area AR1 of the display area DA. Each of the plurality of dummy lines DML may have a shape that is bent at least twice. Each of the dummy lines DML may include a plurality of horizontal dummy patterns and a plurality of vertical dummy patterns. The plurality of horizontal dummy patterns may be spaced apart from each other by at least one row interval, and the plurality of vertical dummy patterns may be spaced apart from each other by at least one column interval. The plurality of horizontal dummy patterns and the plurality of vertical dummy patterns may be arranged on different layers from one another. This will be described in more detail with reference to FIG. 7.

FIG. 4 shows an example in which the plurality of dummy lines DML are all connected without a disconnected portion. In other words, the dummy lines DML are shown in FIG. 4 as extending across the display panel 10 in the second direction (e.g., the x direction) without a disconnected portion. However, the plurality of dummy lines DML may include a partially disconnected portion. For example, the plurality of dummy lines DML may be disconnected at a portion corresponding to the first line ℓ. As another example, the plurality of dummy lines DML may be disconnected at the left edge of the display panel 10 and at the central portion of the first line ℓ.

Figure 5:
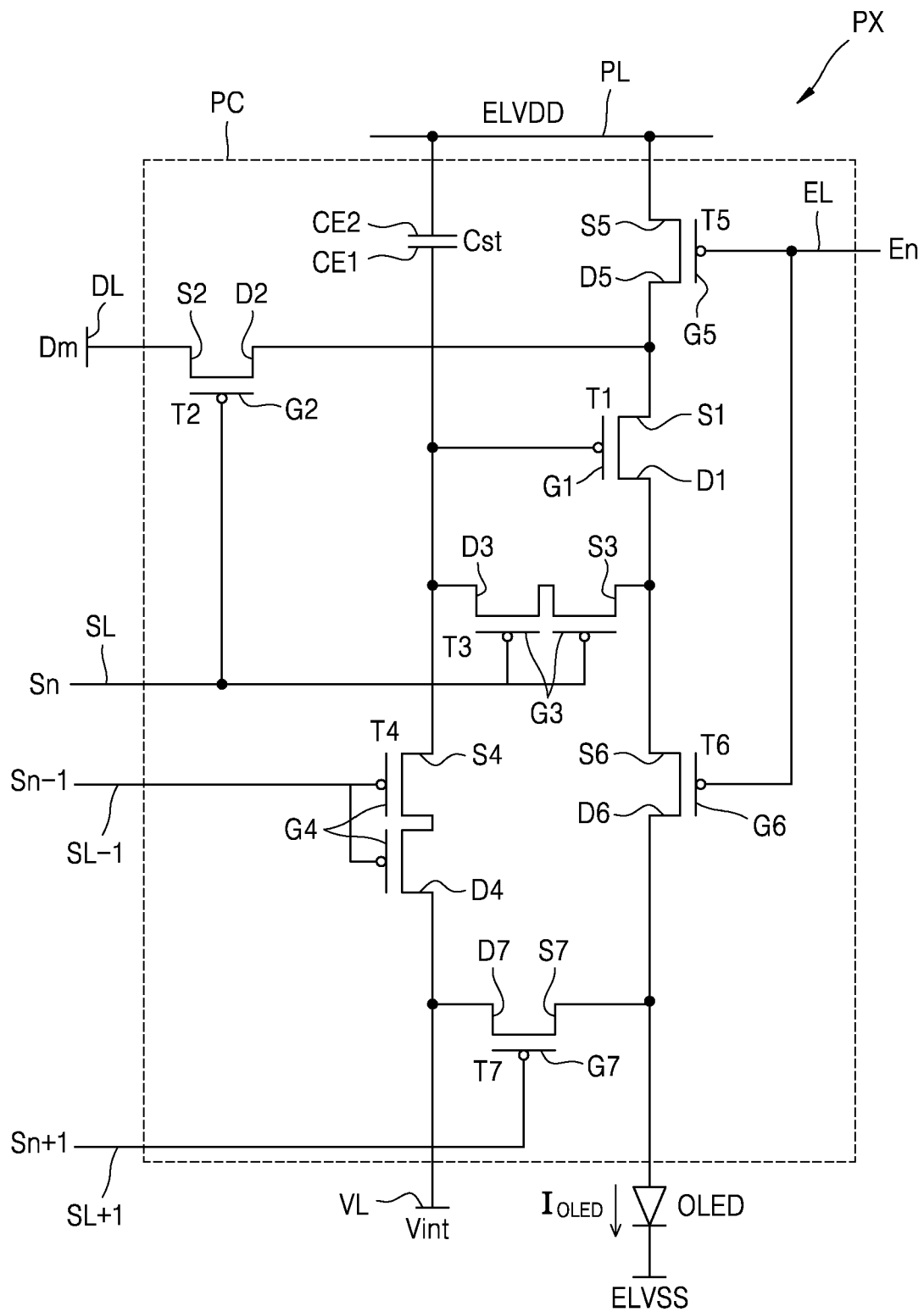
FIG. 5 is an equivalent circuit diagram of a pixel arranged in a display panel according to an embodiment.

FIG. 5 is an equivalent circuit diagram of a pixel arranged in a display panel according to an embodiment.

Referring to FIG. 5, a pixel (e.g., one pixel) PX may include a pixel circuit PC, and an organic light-emitting diode OLED electrically connected to the pixel circuit PC.

As an example, as shown in FIG. 5, the pixel circuit PC includes first to seventh thin-film transistors T1 to T7, and a storage capacitor Cst. The first to seventh thin-film transistors T1 to T7 and the storage capacitor Cst are connected to first to third scan lines SL, SL−1, and SL+1 configured to transmit first to third scan signals Sn, Sn−1, and Sn+1, respectively, a data line DL configured to transmit a data voltage Dm, an emission control line EL configured to transmit an emission control signal En, a driving voltage line PL configured to transmit a driving voltage ELVDD, an initialization voltage line VL configured to transmit an initialization voltage Vint, and a common electrode to which a common voltage ELVSS is applied.

The first thin-film transistor T1 may be a driving transistor in which the magnitude of a drain current is determined according to a gate-source voltage. The second to seventh thin-film transistors T2 to T7 may be switching transistors that are turned on/off according to a gate-source voltage, which may correspond to or substantially correspond to the gate voltage.

The first thin-film transistor T1 may be referred to as the driving thin-film transistor, the second thin-film transistor T2 may be referred to as a scan thin-film transistor, the third thin-film transistor T3 may be referred to as a compensation thin-film transistor, the fourth thin-film transistor T4 may be referred to as a gate initialization thin-film transistor, the fifth thin-film transistor T5 may be referred to as a first emission control thin-film transistor, the sixth thin-film transistor T6 may be referred to as a second emission control thin-film transistor, and the seventh thin-film transistor T7 may be referred to as an anode initialization thin-film transistor.

The storage capacitor Cst is connected between the driving voltage line PL and a driving gate G1 of the driving thin-film transistor T1. The storage capacitor Cst may have a second electrode CE2 connected to the driving voltage line PL, and a first electrode CE1 connected to the driving gate G1 of the driving thin-film transistor T1.

The driving thin-film transistor T1 may control the magnitude of driving current $I_{OLED}$ flowing from the driving voltage line PL to the organic light-emitting diode OLED, according to the gate-source voltage. The driving thin-film transistor T1 may include the driving gate G1 connected to the first electrode CE1 of the storage capacitor Cst, a driving source S1 connected to the driving voltage line PL through the first emission control thin-film transistor T5, and a driving drain D1 connected to the organic light-emitting diode OLED through the second emission control thin-film transistor T6.

The driving thin-film transistor T1 may output the driving current $I_{OLED}$ to the organic light-emitting diode OLED according to the gate-source voltage. A magnitude of the driving current $I_{OLED}$ is determined based on the difference between the gate-source voltage and a threshold voltage of the driving thin-film transistor T1. The organic light-emitting diode OLED may receive the driving current $I_{OLED}$ from the driving thin-film transistor T1, and may emit light with a brightness corresponding to a magnitude of the driving current $I_{OLED}$.

The scan thin-film transistor T2 may transmit the data voltage Dm to the driving source S1 of the driving thin-film transistor T1 in response to the first scan signal Sn. The scan thin-film transistor T2 may include a scan gate G2 connected to the first scan line SL, a scan source S2 connected to the data line DL, and a scan drain D2 connected to the driving source S1 of the driving thin-film transistor T1.

The compensation thin-film transistor T3 is connected (e.g., is serially connected) between the driving drain D1 and the driving gate G1 of the driving thin-film transistor T1, and connects the driving drain D1 to the driving gate G1 of the driving thin-film transistor T1 in response to the first scan signal Sn. In other words, the compensation thin-film transistor T3 may diode-connect the driving thin-film transistor T1 when the compensation thin-film transistor is turned on. The compensation thin-film transistor T3 may include a compensation gate G3 connected to the first scan line SL, a compensation source S3 connected to the driving drain D1 of the driving thin-film transistor T1, and a compensation drain D3 connected to the driving gate G1 of the driving thin-film transistor T1. Although FIG. 2 shows that the compensation thin-film transistor T3 includes two thin-film transistors connected in series with each other, the present disclosure is not limited thereto, and in another embodiment, for example, the compensation thin-film transistor T3 may be composed of one thin-film transistor.

The gate initialization thin-film transistor T4 applies the initialization voltage Vint to the driving gate G1 of the driving thin-film transistor T1 in response to the second scan signal Sn−1. The gate initialization thin-film transistor T4 may include a first initialization gate G4 connected to the second scan line SL−1, a first initialization source S4 connected to the driving gate G1 of the driving thin-film transistor T1, and a first initialization drain D4 connected to the initialization voltage line VL. In FIG. 5, the gate initialization thin-film transistor T4 is illustrated as including two thin-film transistors connected in series with each other, but the present disclosure is not limited thereto, and in another embodiment, for example, the gate initialization thin-film transistor T4 may be composed of one thin-film transistor.

The anode initialization thin-film transistor T7 applies the initialization voltage Vint to the anode of the organic light-emitting diode OLED in response to the third scan signal Sn+1. The anode initialization thin-film transistor T7 may include a second initialization gate G7 connected to the third scan line SL+1, a second initialization source S7 connected to the anode of the organic light-emitting diode OLED, and a second initialization drain D7 connected to the initialization voltage line VL.

The first emission control thin-film transistor T5 may connect the driving voltage line PL to the driving source S1 of the driving thin-film transistor T1 in response to the emission control signal En. The first emission control thin-film transistor T5 may include a first emission-control gate G5 connected to the emission control line EL, a first emission-control source S5 connected to the driving voltage line PL, and a first emission-control drain D5 connected to the driving source S1.

The second emission control thin-film transistor T6 may connect the driving drain D1 of the driving thin-film transistor T1 to the anode of the organic light-emitting diode OLED in response to the emission control signal En. The second emission control thin-film transistor T6 may include a second emission-control gate G6 connected to the emission control line EL, a second emission-control source S6 connected to the driving drain D1 of the driving thin-film transistor T1, and a second emission-control drain D6 connected to the anode of the organic light-emitting diode OLED.

The second scan signal Sn−1 may be synchronized or substantially synchronized with the first scan signal Sn of a previous row. The third scan signal Sn+1 may be synchronized or substantially synchronized with the first scan signal Sn. According to another example, the third scan signal Sn+1 may be synchronized or substantially synchronized with the first scan signal Sn of a next row (e.g., a subsequent row).

In an embodiment, the first to seventh thin-film transistors T1 to T7 may include a semiconductor layer including (e.g., containing) silicon. For example, the first to seventh thin-film transistors T1 to T7 may include a semiconductor layer including a low temperature poly-silicon (LTPS). The poly-silicon material has high electron mobility (e.g., over 100 cm$^2$/Vs), low energy consumption, and excellent reliability. As another example, semiconductor layers of the first to seventh thin-film transistors T1 to T7 may include oxides of at least one material selected from the group consisting of indium (In), gallium (Ga), stannium (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, a semiconductor layer A may be an InSnZnO (ITZO) semiconductor layer, an InGaZnO (IGZO) semiconductor layer, or the like. As another example, some semiconductor layers of the first to seventh thin-film transistors T1 to T7 may include a low-temperature polysilicon (LTPS), and some other semiconductor layers thereof may include an oxide semiconductor (e.g., IGZO).

Hereinafter, an operation process of the pixel (e.g., one pixel) PX of the display panel 10, according to an embodiment, will be described in more detail. For convenience of description, the operation process of the pixel PX is described hereinafter assuming that the first to seventh thin-film transistors T1 to T7 are p-type metal oxide silicon field effect transistors (MOSFETs) as shown in FIG. 5, but the present disclosure is not limited thereto.

First, when a high-level emission control signal En is received, the first emission control thin-film transistor T5 and the second emission control thin-film transistor T6 are turned off, the driving thin-film transistor T1 stops outputting (or does not output) the driving current $I_{OLED}$, and the organic light-emitting diode OLED stops emitting (or does not emit) light.

Thereafter, during a gate initialization period in which a low-level second scan signal Sn−1 is received, the gate initialization thin-film transistor T4 is turned on, and the initialization voltage Vint is applied to the driving gate G1 of the driving thin-film transistor T1, or in other words, to the first electrode CE1 of the storage capacitor Cst. A difference (e.g., ELVDD-Vint) between the driving voltage ELVDD and the initialization voltage Vint is stored in the storage capacitor Cst.

Thereafter, during a data writing period in which a low-level first scan signal Sn is received, the scan thin-film transistor T2 and the compensation thin-film transistor T3 are turned on, and the driving source S1 of driving thin-film transistor T1 receives the data voltage Dm. The driving thin-film transistor T1 is diode-connected by the compensation thin-film transistor T3, and thus, is compensated in a forward-bias direction. A gate voltage of the driving thin-film transistor T1 rises at (e.g., increases according to) the initialization voltage Vint. When the gate voltage of the driving thin-film transistor T1 becomes equal to or substantially equal to a data compensation voltage (e.g., Dm-|Vth|), which is obtained by subtracting a threshold voltage Vth of the driving thin-film transistor T1 from a data voltage Dm, the driving thin-film transistor is turned off, and the rise (e.g., the increase) of the gate voltage of the driving thin-film transistor T1 stops. Accordingly, the storage capacitor Cst stores the difference (e.g., ELVDD-Dm+|Vth|) between the driving voltage ELVDD and the data compensation voltage (e.g., Dm-|Vth|).

In addition, during an anode initialization period when a low-level third scan signal Sn+1 is received, the anode initialization thin-film transistor T7 is turned on, and the initialization voltage Vint is applied to the anode of the organic light-emitting diode OLED. By applying the initialization voltage Vint to the anode of the organic light-emitting diode OLED, such that the organic light-emitting diode OLED is completely non-emitted, it may be possible to reduce or eliminate a phenomenon in which the organic light-emitting diode OLED emits light (e.g., finely emits light), even though in the next frame, the pixel PX receives a data voltage Dm corresponding to a black gradation (e.g., a black grayscale or a black gray level).

The first scan signal Sn and the third scan signal Sn+1 may be synchronized or substantially synchronized with each other, and in this case, the data writing period and the anode initialization period may be the same or substantially the same period as each other.

Then, when a low-level emission control signal En is received, the first emission control thin-film transistor T5 and the second emission control thin-film transistor T6 are turned on, the driving thin-film transistor T1 may output a driving current $I_{OLED}$ corresponding to a voltage stored in the storage capacitor Cst, that is, a voltage (e.g., ELVDD-Dm) obtained by subtracting the threshold voltage (|Vth|) of the driving thin-film transistor T1 from the source-gate voltage (e.g., ELVDD-Dm+|Vth|) of driving thin-film transistor T1, and the organic light-emitting diode OLED may emit light with a luminance corresponding to the magnitude of the driving current $I_{OLED}$.

Figure 6:
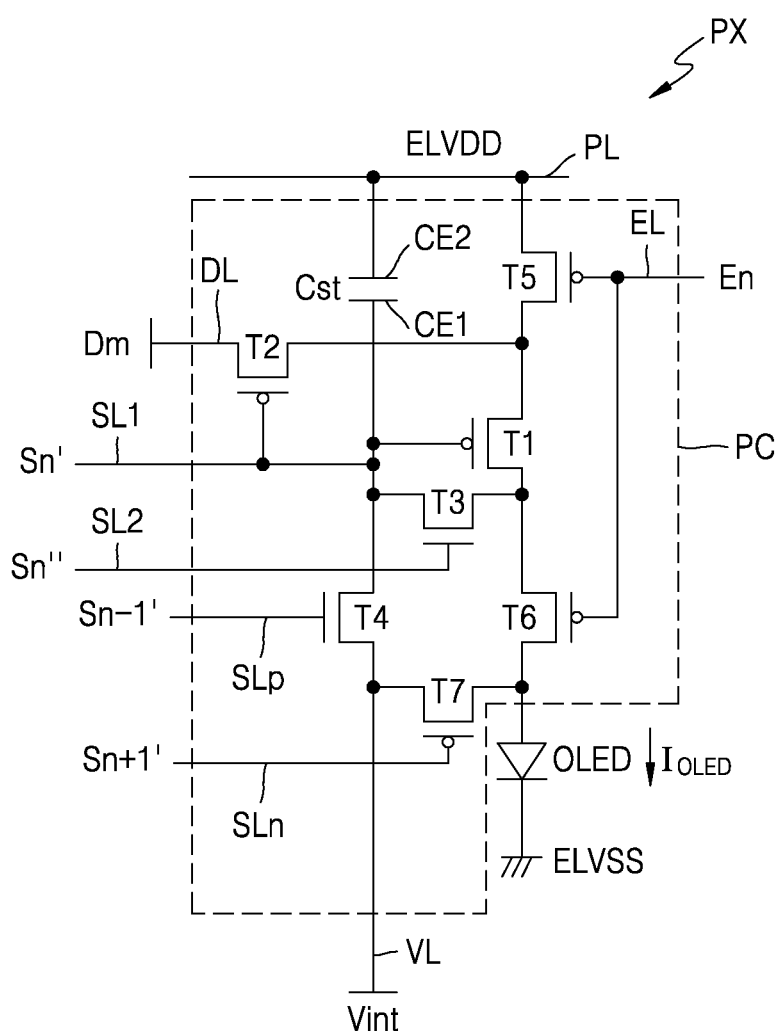
FIG. 6 is an equivalent circuit diagram of a pixel arranged in a display panel according to an embodiment.

FIG. 6 is an equivalent circuit diagram of a pixel arranged in a display panel according to an embodiment.

Referring to FIG. 6, the pixel (e.g., one pixel) PX may include a pixel circuit PC, and an organic light-emitting diode OLED electrically connected to the pixel circuit PC.

As an example, as shown in FIG. 6, the pixel circuit PC includes first to seventh thin-film transistors T1 to T7, and a storage capacitor Cst. The first to seventh thin-film transistors T1 to T7 and the storage capacitor Cst may be connected to signal lines SL1, SL2, SLp, SLn, EL, and DL, an initialization voltage line VL, and a driving voltage line PL. In some embodiments, at least one of the signal lines SL1, SL2, SLp, SLn, EL, and DL, the initialization voltage line VL, and/or the driving voltage line PL may be shared by neighboring pixels (e.g., by one or more adjacent pixels) PX.

The first thin-film transistor T1 may be referred to as a driving thin-film transistor, the second thin-film transistor T2 may be referred to as a scan thin-film transistor, the third thin-film transistor T3 may be referred to as a compensation thin-film transistor, the fourth thin-film transistor T4 may be referred to as a gate initialization thin-film transistor, the fifth thin-film transistor T5 may be referred to as a first emission control thin-film transistor, the sixth thin-film transistor T6 may be referred to as a second emission control thin-film transistor, and the seventh thin-film transistor T7 may be referred to as an anode initialization thin-film transistor.

Some of the first to seventh thin-film transistors T1 to T7 may be n-channel MOSFETs, and the others thereof may be P-channel MOSFETs.

For example, as shown in FIG. 6, each of the compensation thin-film transistor T3 and the gate initialization thin-film transistor T4 may be an n-channel MOSFET, and each of the driving thin-film transistor T1, the scan thin-film transistor T2, the first emission control thin-film transistor T5, the second emission control thin-film transistor T6, and the anode initialization thin-film transistor T7 may be a p-channel MOSFET.

In another embodiment, each of the compensation thin-film transistor T3, the gate initialization thin-film transistor T4, and the anode initialization thin-film transistor T7 may be an n-channel MOSFET, and each of the driving thin-film transistor T1, the scan thin-film transistor T2, the first emission control thin-film transistor T5, and the second emission control thin-film transistor T6 may be a p-channel MOSFET. In another embodiment, only one from among the first to seventh thin-film transistors T1 to T7 may be an n-channel MOSFET, and the each of the others thereof (e.g., each of the rest thereof) may be a p-channel MOSFET. In another embodiment, each of the first to seventh thin-film transistors T1 to T7 may be an n-channel MOSFET.

The signal lines SL1, SL2, SLp, SLn, EL, and DL include a first scan line SL1 configured to transmit a first scan signal Sn', a second scan line SL2 configured to transmit a second scan signal Sn", a previous scan line SLp configured to transmit a previous scan signal Sn-1' to the gate initialization thin-film transistor T4, an emission control line EL configured to transmit an emission control signal En to the first emission control thin-film transistor T5 and the second emission control thin-film transistor T6, a next scan line SLn configured to transmit a next scan signal Sn+1' to the anode initialization thin-film transistor T7, and a data line DL crossing the first scan line SL1 and configured to transmit a data voltage Dm.

The driving voltage line PL is configured to transmit a driving voltage ELVDD to the driving thin-film transistor T1, and the initialization voltage line VL is configured to transmit an initialization voltage Vint for initializing the driving thin-film transistor T1 and the anode of the organic light-emitting diode OLED.

A driving gate of the driving thin-film transistor T1 is connected to the storage capacitor Cst, and a driving source of the driving thin-film transistor T1 is connected to the driving voltage line PL via the first emission control thin-film transistor T5. A driving drain of the driving thin-film transistor T1 is electrically connected to an anode of the organic light-emitting diode OLED via the second emission control thin-film transistor T6. The driving thin-film transistor T1 receives the data voltage Dm according to a switching operation of the scan thin-film transistor T2, and supplies a driving current $I_{OLED}$ to the organic light-emitting diode OLED.

A scan gate of the scan thin-film transistor T2 is connected to the first scan line SL1, a scan source of the scan thin-film transistor T2 is connected to the data line DL, and a scan drain of the scan thin-film transistor T2 is connected to the driving source of the driving thin-film transistor T1 and to the driving voltage line PL via the first emission control thin-film transistor T5. The scan thin-film transistor T2 is turned on according to the first scan signal Sn' received through the first scan line SL1, and performs a switching operation to transfer the data voltage Dm transmitted to the data line DL to the driving source of the driving thin-film transistor T1.

A compensation gate of the compensation thin-film transistor T3 is connected to the second scan line SL2. A compensation drain of the compensation thin-film transistor T3 is connected to the driving drain of the driving thin-film transistor T1 and to the anode of the organic light-emitting diode OLED via the second light emission control thin-film transistor T6. A compensation source of the compensation thin-film transistor T3 is connected to a first electrode CE1 of the storage capacitor Cst and to the driving gate of the driving thin-film transistor T1. In addition, the compensation source is connected to a first initialization drain of the gate initialization thin-film transistor T4.

The compensation thin-film transistor T3 is turned on according to the second scan signal Sn" received through the second scan line SL2 to electrically connect the driving gate and the driving drain of the driving thin-film transistor T1, and thus, the driving thin-film transistor T1 is diode-connected when the compensation thin-film transistor T3 is turned on.

A first initialization gate of the gate initialization thin-film transistor T4 is connected to the previous scan line SLp. A first initialization source of the gate initialization thin-film transistor T4 is connected to a second initialization source of the anode initialization thin-film transistor T7 and to the initialization voltage line VL. The first initialization drain of the gate initialization thin-film transistor T4 is connected to the first electrode CE1 of the storage capacitor Cst, to the compensation source of the compensation thin-film transistor T3, and to the driving gate of the driving thin-film transistor T1. The gate initialization thin-film transistor T4 is turned on according to the previous scan signal Sn−1' received through the previous scan line SLp to transmit the initialization voltage Vint to the driving gate of the driving thin-film transistor T1, and thus, performs an initialization operation to initialize the voltage of the driving gate of the driving thin-film transistor T1.

A first emission control gate of the first emission control thin-film transistor T5 is connected to the emission control line EL, a first emission control source of the first emission control thin-film transistor T5 is connected to the driving voltage line PL, and the first emission control drain of the first emission control thin-film transistor T5 is connected to the driving source of the driving thin-film transistor T1 and to the scan drain of the scan thin-film transistor T2.

A second emission control gate of the second emission control thin-film transistor T6 is connected to the emission control line EL, a second emission control source of the second emission control thin-film transistor T6 is connected to the driving drain of the driving thin-film transistor T1 and to the compensation drain of the compensation thin-film transistor T3, and a second emission control drain of the second emission control thin-film transistor T6 is electrically connected to a second initialization drain of the anode initialization thin-film transistor T7 and to the anode of the organic light-emitting diode OLED.

The first emission control thin-film transistor T5 and the second emission control thin-film transistor T6 are concurrently (e.g., simultaneously) turned on according to the emission control signal En transmitted through the emission control line EL, and thus, the driving voltage ELVDD is transmitted to the organic light-emitting diode OLED such that the driving current $I_{OLED}$ flows in the organic light-emitting diode OLED.

A second initialization gate of the anode initialization thin-film transistor T7 is connected to the next scan line SLn, the second initialization drain of the anode initialization thin-film transistor T7 is connected to the second emission control drain of the second emission control thin-film transistor T6 and to the anode of the organic light-emitting diode OLED, and the second initialization source of the anode initialization thin-film transistor T7 is connected to the first initialization source of the gate initialization thin-film transistor T4 and to the initialization voltage line VL. The anode initialization thin-film transistor T7 is turned on according to the next scan signal Sn+1' transmitted through the next scan line SLn, and initializes the anode of the organic light-emitting diode OLED.

The anode initialization thin-film transistor T7 may be connected to the next scan line SLn, as shown in FIG. 6. In another embodiment, the anode initialization thin-film transistor T7 may be connected to the emission control line EL and driven according to the emission control signal En. The positions of a source and a drain of a transistor may be modified depending on the type (e.g., p-type or n-type) of the transistor.

The storage capacitor Cst includes a first electrode CE1 and a second electrode CE2. The first electrode CE1 of the storage capacitor Cst is connected to the driving gate of the driving thin-film transistor T1, and the second electrode CE2 of the storage capacitor Cst is connected to the driving voltage line PL. The storage capacitor Cst may store a charge corresponding to the difference between a voltage of the driving gate of the driving thin-film transistor T1 and the driving voltage ELVDD.

A detailed operation of a pixel (e.g., of each pixel) PX according to an embodiment is described hereinafter.

During an initialization period, when the previous scan signal Sn−1 is supplied through the previous scan line SLp, the gate initialization thin-film transistor T4 is turned on in response to the previous scan signal Sn−1, and the driving thin-film transistor T1 is initialized by the initialization voltage Vint supplied from the initialization voltage line VL.

During a data programming period, when the first scan signal Sn' and the second scan signal Sn" are supplied through the first scan line SL1 and the second scan line SL2, respectively, the scan thin-film transistor T2 and the compensation thin-film transistor T3 are turned on in response to the first scan signal Sn' and the second scan signal Sn", respectively. In this case, the driving thin-film transistor T1 is diode-connected by the turned-on compensation thin-film transistor T3 and biased in a forward direction.

Then, a compensation voltage (e.g., Dm+Vth, where Vth has a negative value), which is obtained by subtracting a threshold voltage Vth of the driving thin-film transistor T1 from the data voltage Dm supplied from the data line DL, is applied to the driving gate of the driving thin-film transistor T1.

The driving voltage ELVDD and the compensation voltage (e.g., Dm+Vth) are respectively applied to ends (e.g., to both ends) of the storage capacitor Cst, and charges corresponding to a voltage difference between the ends of the storage capacitor Cst are stored in the storage capacitor Cst.

During an emission period, the first emission control thin-film transistor T5 and the second emission control thin-film transistor T6 are turned on by the emission control signal En supplied from the emission control line EL. A driving current $I_{OLED}$ according to a voltage difference between the voltage of the driving gate of the driving thin-film transistor T1 and the driving voltage ELVDD is generated, and the driving current $I_{OLED}$ is supplied to the organic light-emitting diode OLED through the second emission control thin-film transistor T6.

In the present embodiment, at least one of the first to seventh thin-film transistors T1 to T7 includes a semiconductor layer including an oxide, and the others thereof include a semiconductor layer including silicon. In more detail, the driving thin-film transistor T1 that directly affects the brightness of the display device may include a semiconductor layer made of polycrystalline silicon having high reliability to thereby implement a high-resolution display device.

Oxide semiconductor has high carrier mobility and low leakage current, and thus, even though a driving time of the driving thin-film transistor T1 is long, a voltage drop in the driving thin-film transistor T1 may not be large. In other words, because a color change of an image due to the voltage drop may not be large even during low frequency driving, the low frequency driving may be performed.

As described above, because the oxide semiconductor has a small leakage current, at least one of the compensation thin-film transistor T3 connected to the driving gate of the driving thin-film transistor T1, the gate initialization thin-film transistor T4, and the anode initialization thin-film transistor T7 may employ the oxide semiconductor to reduce or prevent the leakage current that may flow to the driving gate, and to reduce power consumption.

Figure 7:
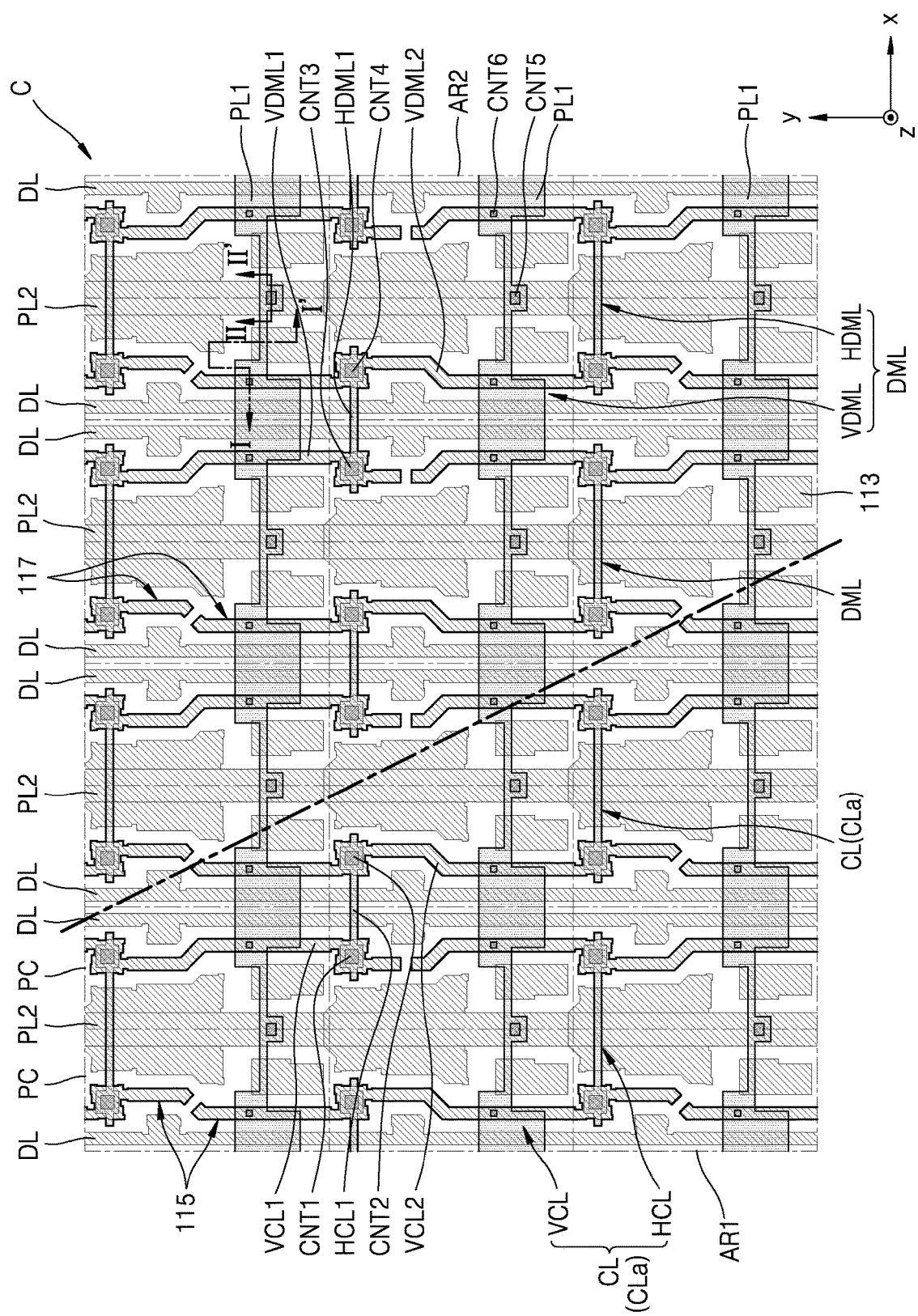
FIG. 7 is an enlarged plan view showing the portion C of FIG. 4.
Figure 8A:
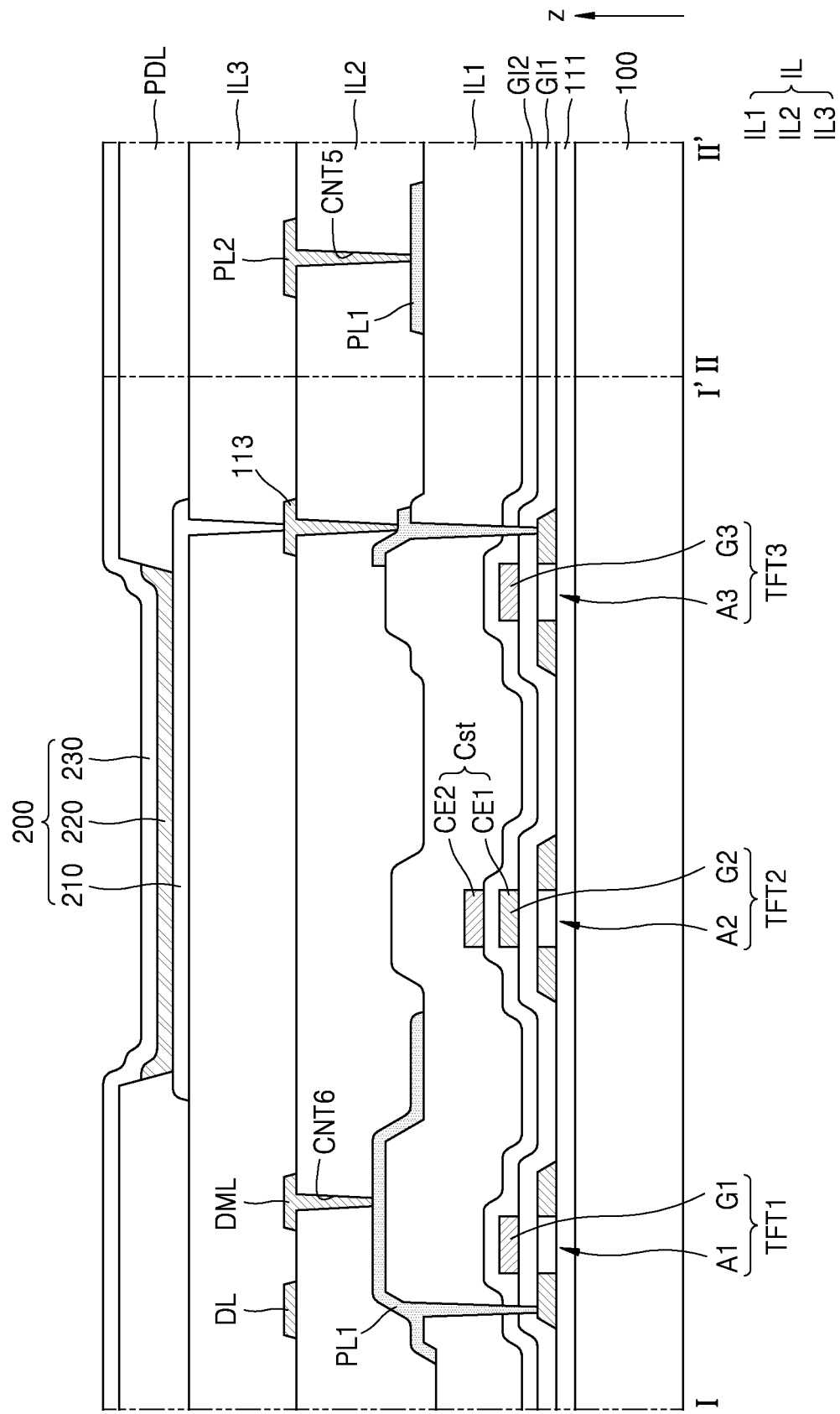
FIGS. 8A and 8B are cross-sectional views of a display panel taken along the line I-I' and the line II-II' of FIG. 7.

FIG. 7 is an enlarged plan view showing the portion C of FIG. 4, and FIG. 8A is a cross-sectional view of the display panel taken along the line I-I' and the line II-II' of FIG. 7.

FIG. 7 is a partially enlarged view of the first area AR1 and the second area AR2 of the display area DA, and corresponds to some of a plurality of pixel circuits PCs arranged at (e.g., in or on) a plurality of rows and a plurality of columns. In addition, FIG. 7 partially illustrates some of a plurality of layers constituting a plurality of pixel circuits PC.

Referring to FIG. 7, the display panel 10 (e.g., see FIG. 4) may include a plurality of pixel circuits PC, and each of the pixel circuits PC may include a data line DL, a connection line CL, a dummy line DML, a first voltage line PL1, and a second voltage line PL2.

Each of the plurality of pixel circuits PC may include either the pixel circuit PC of FIG. 5 or the pixel circuit PC of FIG. 6. In an embodiment, as shown in FIG. 7, the pixel circuit PC may be arranged to form a symmetrical or substantially symmetrical shape with a pixel circuit PC adjacent thereto. As another example, a plurality of pixel circuits PCs arranged in a plurality of rows and a plurality of columns may have the same or substantially the same shape as each other.

At (e.g., in or on) the first area AR1 and the second area AR2 of the display area DA, the data line DL may be located across the plurality of pixel circuits PC. The data line DL may extend in the first direction (e.g., the y direction).

At (e.g., in or on) the first area AR1 of the display area DA, the connection line CL may be located across the plurality of pixel circuits PC.

The connection line CL may have a shape that is bent at least twice, as shown in FIG. 7. The connection line CL may include a plurality of horizontal connection patterns HCL and a plurality of vertical connection patterns VCL, which are alternately connected to one another. The plurality of horizontal connection patterns HCL may be spaced apart from each other by at least one row interval. The plurality of vertical connection patterns VCL may be spaced apart from each other by at least one column interval.

The plurality of horizontal connection patterns HCL and the plurality of vertical connection patterns VCL may be arranged on different layers from one another. For example, the plurality of vertical connection patterns VCL may be arranged on the plurality of horizontal connection patterns HCL, and the plurality of vertical connection patterns VCL may be respectively connected to the plurality of horizontal connection patterns HCL through a first contact hole CNT1 and a second contact hole CNT2 defined in an insulating layer IL.

One side of a first horizontal connection pattern HCL1 that is one of the plurality of horizontal connection patterns HCL may be connected to a first vertical connection pattern VCL1 extending in a third direction of the first direction (e.g., a +y direction) from among the plurality of vertical connection patterns VCL, and the other side of the first horizontal connection pattern HCL1 may be connected to a second vertical connection pattern VCL2 extending in a fourth direction of the first direction (e.g., a −y direction), which is opposite to the third direction, from among the plurality of vertical connection patterns VCL.

Each of the plurality of vertical connection patterns VCL may include first branches 115, each protruding in the third direction (e.g., the +y direction) and/or the fourth direction (e.g., the −y direction).

At (e.g., in or on) the second area AR2 of the display area DA, the dummy line DML may be located across the plurality of pixel circuits PC.

The dummy line DML may have a shape that is bent at least twice, as shown in FIG. 7. The dummy line DML may include a plurality of horizontal dummy patterns HDML and a plurality of vertical dummy patterns VDML, which are alternately connected to one another. The plurality of horizontal dummy patterns HDML may be spaced apart from each other by at least one row interval. The plurality of vertical dummy patterns VDML may be spaced apart from each other by at least one column interval.

The plurality of horizontal dummy patterns HDML and the plurality of vertical dummy patterns VDML may be arranged on different layers from one another. For example, the plurality of vertical dummy patterns VDML may be arranged on the plurality of horizontal dummy patterns HDML, and the plurality of vertical dummy patterns VDML may be respectively connected to the plurality of horizontal dummy patterns HDML through a third contact hole CNT3 and a fourth contact hole CNT4 defined in the insulating layer IL.

One side of a first horizontal dummy pattern HDML1 that is one of the plurality of horizontal dummy patterns HDML may be connected to a first vertical dummy pattern VDML1 extending in the third direction (e.g., the +y direction) from among the plurality of vertical dummy patterns VDML, and the other side of the first horizontal dummy pattern HDML1 may be connected to a second vertical dummy pattern VDML2 extending in the fourth direction (e.g., the −y direction) from among the plurality of vertical dummy patterns VDML.

Each of the plurality of vertical dummy patterns VDML may include second branches 117, each protruding in the third direction (e.g., the +y direction) and/or the fourth direction (e.g., the −y direction).

The plurality of horizontal dummy patterns HDML and the plurality of horizontal connection patterns HCL may be arranged at (e.g., in or on) the same layer as each other, and the plurality of vertical dummy patterns VDML and the plurality of vertical connection patterns VCL may be arranged at (e.g., in or on) the same layer as each other. The expression "the patterns are arranged at (e.g., in or on) the same layer as each other" may denote that the patterns are arranged at (e.g., in or on) the same insulating layer as each other.

The first voltage line PL1 may extend in the second direction (e.g., the x direction), and the second voltage line PL2 may extend in the first direction (e.g., the y direction) crossing the second direction. The first voltage line PL1 and the second voltage line PL2 may be arranged on different layers from each other, and the first voltage line PL1 and the second voltage line PL2 may be connected to each other through a fifth contact hole CNT5 defined in the insulating layer IL. As shown in FIG. 7, a plurality of first voltage lines PL1 and a plurality of second voltage lines PL2 may be provided. The plurality of first voltage lines PL1 and the plurality of second voltage lines PL2 may form a mesh structure.

The first voltage line PL1 and the second voltage line PL2 may be connected to a voltage supply line arranged at an upper end portion and/or a lower end portion of the display panel 10 to receive a voltage. For example, the voltage supplied to the first voltage line PL1 and the second voltage line PL2 may be the driving voltage ELVDD (e.g., see FIGS. 5 and 6).

The dummy line DML may be connected to at least one of the first voltage line PL1 and the second voltage line PL2. For example, as shown in FIG. 7, the dummy line DML may be connected to the first voltage line PL1 through a sixth contact hole CNT6 defined in the insulating layer IL.

Because the dummy line DML is connected to the first voltage line PL1 through the sixth contact hole CNT6, the dummy line DML may overlap with at least one sixth contact hole CNT6. Although FIG. 7 illustrates a case in which the dummy line DML overlaps with three or more sixth contact holes CNT6, this illustration is only an example, and some of the three or more sixth contact holes CNT6 may be omitted.

As a comparative example, a plurality of dummy lines may be formed in a mesh structure in which the plurality of dummy lines are all connected without a disconnected portion. In this case, each of the plurality of dummy lines may not need to be connected to a voltage line, and may be connected to a voltage supply line arranged at an upper end portion and/or a lower end portion of the display panel to prevent or substantially prevent a floating state. However, connection lines for applying data signals to data lines arranged on the left and right sides of the display panel are formed in a stepwise manner, and in the connection lines, there may be various disconnected portions unlike the dummy lines in this example. Therefore, the shape of a pixel circuit at (e.g., in or on) an area where the connection lines are arranged may be different from the shape of a pixel circuit at (e.g., in or on) an area where the dummy lines are arranged. Also, the amount of metal material at (e.g., in or on) the area where the connection lines are arranged may be different from the amount of metal material at (e.g., in or on) the area where the dummy lines are arranged. In this example, in a non-driving state of the display panel, a visibility difference may occur between the area where the connection lines are arranged and the area where the dummy lines are arranged, depending on a difference in the amount of metal materials between the two areas.

In the present embodiment, however, when the dummy line DML has a disconnected portion similar to the connection line CL, and has a shape that is bent at least twice (e.g., when the shape of the dummy line DML is the same as or substantially the same as that of the connection line CL), there may be no difference in the amount of metal materials between the first area AR1 where the connection lines CL are arranged and the second area AR2 where the dummy lines DML are arranged. Therefore, in the non-driving state of the display panel, the visibility difference that may occur between the first area AR1 where the connection lines CL are arranged and the second area AR2 where the dummy lines DML are arranged may be reduced.

In addition, the dummy line DML may be connected to at least one of a plurality of first voltage lines PL1 arranged in a plurality of rows. In this case, the dummy line DML may be connected to the first voltage line PL1, which may be connected to a voltage supply line to receive a voltage. Therefore, it may be possible to prevent or substantially to prevent the dummy line DML from being maintained in a floating state.

The dummy lines DML may be connected to the first voltage line PL1 through at least two sixth contact holes CNT6 that are spaced apart from each other. In this case, the overall resistance of a supply network due to a voltage drop of the driving voltage ELVDD supplied to the first voltage line PL1 and the second voltage line PL2 arranged in a mesh structure may be reduced.

Hereinafter, with reference to FIG. 8A, a display element and various elements electrically connected to the display element will be described in more detail according to a stacking order and a position relationship between the dummy line DML and the first and second voltage lines PL1 and PL2.

The substrate 100 may include glass or polymer resin. The polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 100 including the polymer resin may be flexible, rollable, and/or bendable. The substrate 100 may have a multi-layered structure including a layer including one or more of the above-described polymer resins and an inorganic layer.

A buffer layer 111 may be arranged on the substrate 100. The buffer layer 111 may reduce or block the penetration of foreign materials, moisture, and/or external air from the bottom of the substrate 100, and may provide a flat or substantially flat surface on the substrate 100. The buffer layer 111 may include an inorganic material, for example, such as an oxide or nitride, an organic material, or an organic-inorganic composite, and may have a single layer structure or a multi-layered structure including an inorganic material and an organic material.

In some embodiments, a barrier layer may be further included between the substrate 100 and the buffer layer 111. In this example, the barrier layer may prevent or reduce impurities from the substrate 100 and/or the like from penetrating into first to third semiconductor layers A1, A2, and A3. The barrier layer may include an inorganic material, for example, such as an oxide or a nitride, an organic material, or an organic-inorganic composite, and may include a single layer structure or a multi-layered structure of the inorganic material and the organic material.

The first to third semiconductor layers A1, A2, and A3 may be arranged on the buffer layer 111. The first to third semiconductor layers A1, A2, and A3 may include amorphous silicon or polysilicon. In another embodiment, each of the first to third semiconductor layers A1, A2, and A3 may include an oxide of at least one material selected from the group consisting of indium (In), gallium (Ga), stannium (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

Each of the first to third semiconductor layers A1, A2, and A3 may include a channel region, and a source region and a drain region arranged at opposite sides (e.g., both sides) of the channel region. Each of the first to third semiconductor layers A1, A2, and A3 may include a single layer or multiple layers.

A first gate insulating layer GI1 and a second gate insulating layer GI2 may be stacked and arranged on the substrate 100 to cover the first to third semiconductor layers A1, A2, and A3. The first gate insulating layer GI1 and the second gate insulating layer GI2 may each include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

A first gate electrode G1 may be arranged on the first gate insulating layer GI1 to at least partially overlap with the first semiconductor layer A1, a second gate electrode G2 may be arranged on the first gate insulating layer GI1 to at least partially overlap with the second semiconductor layer A2, and a third gate electrode G3 may be arranged on the first gate insulating layer GI1 to at least partially overlap with the third semiconductor layer A3.

In an embodiment, the storage capacitor Cst may include a first electrode CE1 and a second electrode CE2, and may overlap with the second thin-film transistor TFT2, as shown in FIG. 7. For example, the second gate electrode G2 of the second thin-film transistor TFT2 may function as the first electrode CE1 of the storage capacitor Cst. In another embodiment, the storage capacitor Cst may not overlap with the second thin-film transistor TFT2, and may be separately formed.

The second electrode CE2 of the storage capacitor Cst overlaps with the first electrode CE1 with the second gate insulating layer GI2 therebetween to form a capacitance. In this case, the second gate insulating layer GI2 may function as a dielectric layer of the storage capacitor Cst.

A first insulating layer IL1 may be arranged on the second gate insulating layer GI2 to cover the second electrode CE2 of the storage capacitor Cst. The first insulating layer IL1 may include $SiO_2$, $SiN_x$, SiON, $Al_2O_3$, $TiO_2$, $Ta_2O_5$, $HfO_2$, $ZnO_2$, or the like.

The first voltage line PL1 may be arranged on the first insulating layer IL1. The first voltage line PL1 may include a conductive material including molybdenum (Mo), aluminum (Al), copper (Cu), titanium (Ti), or the like, and may include multiple layers or a single layer including one or more of the aforementioned materials. For example, the first voltage line PL1 may have a multi-layered structure of Ti/Al/Ti. The first voltage line PL1 may be connected to the first semiconductor layer A1 through a contact hole defined in the first insulating layer IL1.

Second and third insulating layers IL2 and IL3 may be stacked and arranged to cover the first voltage line PL1.

Each of the second and third insulating layers IL2 and IL3 may include a single layer or multiple layers including an organic material, and may provide a flat or substantially flat top surface. Each of the second and third insulating layers IL2 and IL3 may include a commercial polymer, for example, such as benzocyclobutene (BCB), polyimide, hexamethyldisiloxane (HMDSO), polymethyl methacrylate (PMMA), or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like.

The data line DL, the dummy line DML, an electrode layer 113, and the second voltage line PL2 may be arranged on the second insulating layer IL2. The second voltage line PL2 may be connected to the first voltage line PL1 through a fifth contact hole CNT5 defined in the second insulating layer IL2. The dummy line DML may be connected to the first voltage line PL1 through a sixth contact hole CNT6 defined in the second insulating layer IL2. The electrode layer 113 may be connected to the third semiconductor layer A3 through a contact hole defined in the second insulating layer IL2.

A display element 200 may be arranged on the third insulating layer IL3. The display element 200 may include a pixel electrode 210, an intermediate layer 220 including an organic emission layer, and an opposite electrode 230. The pixel electrode 210 may be connected to the third thin-film transistor TFT3 through the electrode layer 113 and a contact hole defined in the third insulating layer IL3.

The pixel electrode 210 may be a (semi)transmissive electrode or a reflective electrode. In some embodiments, the pixel electrode 210 may include a reflective layer including Ag, Mg, Al, Pt, Pd, Au, Ni, Nd, Ir, Cr, and/or a compound thereof, and a transparent or translucent electrode layer formed on the reflective layer. The transparent or translucent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 210 may include a multi-layered structure of ITO/Ag/ITO.

At (e.g., in or on) the display area DA of the substrate 100, a pixel-defining layer PDL may be arranged on the third insulating layer IL3. The pixel-defining layer PDL may prevent or substantially prevent arcs from occurring at the edge of the pixel electrode 210 by increasing the distance between the edge of the pixel electrode 210 and the opposite electrode 230 above the pixel electrode 210.

The pixel-defining layer PDL may include one or more organic insulating materials selected from the group consisting of polyimide, polyamide, acrylic resin, BCB, and phenol resin, and may be formed by spin coating or the like.

The intermediate layer 220 may be arranged in an opening formed by the pixel-defining layer PDL, and may include an organic emission layer. The organic emission layer may include an organic material including, for example, a fluorescent or phosphorescent material that emits red, green, blue, or white light. The organic emission layer may include a low molecular organic material or a high molecular organic material. Under and/or above the organic emission layer, one or more functional layers, for example, such as a hole transport layer (HTL), a hole injection layer (HIL), an electron transport layer (ETL), and/or an electron injection layer (EIL), may be selectively arranged as needed or desired.

The opposite electrode 230 may be a transmissive electrode or a reflective electrode. In some embodiments, the opposite electrode 230 may be a transparent or translucent electrode, and may include a metal thin film having a small work function including, for example, Li, Ca, LiF/Ca, LiF/Al, Al, Ag, Mg, and/or a compounds thereof. In addition, a transparent conductive oxide (TCO) film including ITO, IZO, ZnO, or $In_2O_3$ may be further arranged on the metal thin film. The opposite electrode 230 may be arranged over the display area DA, and may be arranged on the intermediate layer 220 and the pixel-defining layer PDL. The opposite electrode 230 may be integrally formed with respect to a plurality of OLEDs, and may correspond to a plurality of pixel electrodes 210.

Because the organic light-emitting elements may be damaged (e.g., may be easily damaged) by moisture or oxygen from the outside, an encapsulation layer may further cover the organic light-emitting elements to protect the organic light-emitting elements. The encapsulation layer may cover the display area DA, and may extend to at least a portion of the peripheral area PA. The encapsulation layer may include a first inorganic encapsulation layer, an organic encapsulation layer, and a second inorganic encapsulation layer.

Each of the first to third thin-film transistors TFT1, TFT2, and TFT3 shown in FIG. 8A may correspond to any one of the thin-film transistors of FIG. 5. For example, the first thin-film transistor TFT1 may be the first emission control thin-film transistor T5 connected to the driving voltage line PL, the second thin-film transistor TFT2 may be the driving thin-film transistor T1, and the third thin-film transistor TFT3 may be the second emission control thin-film transistor T6. However, the present disclosure is not limited thereto, and the number and/or type of the thin-film transistors shown along the line I-I' and the line II-II' of FIG. 7 may be variously modified.

Figure 8B:
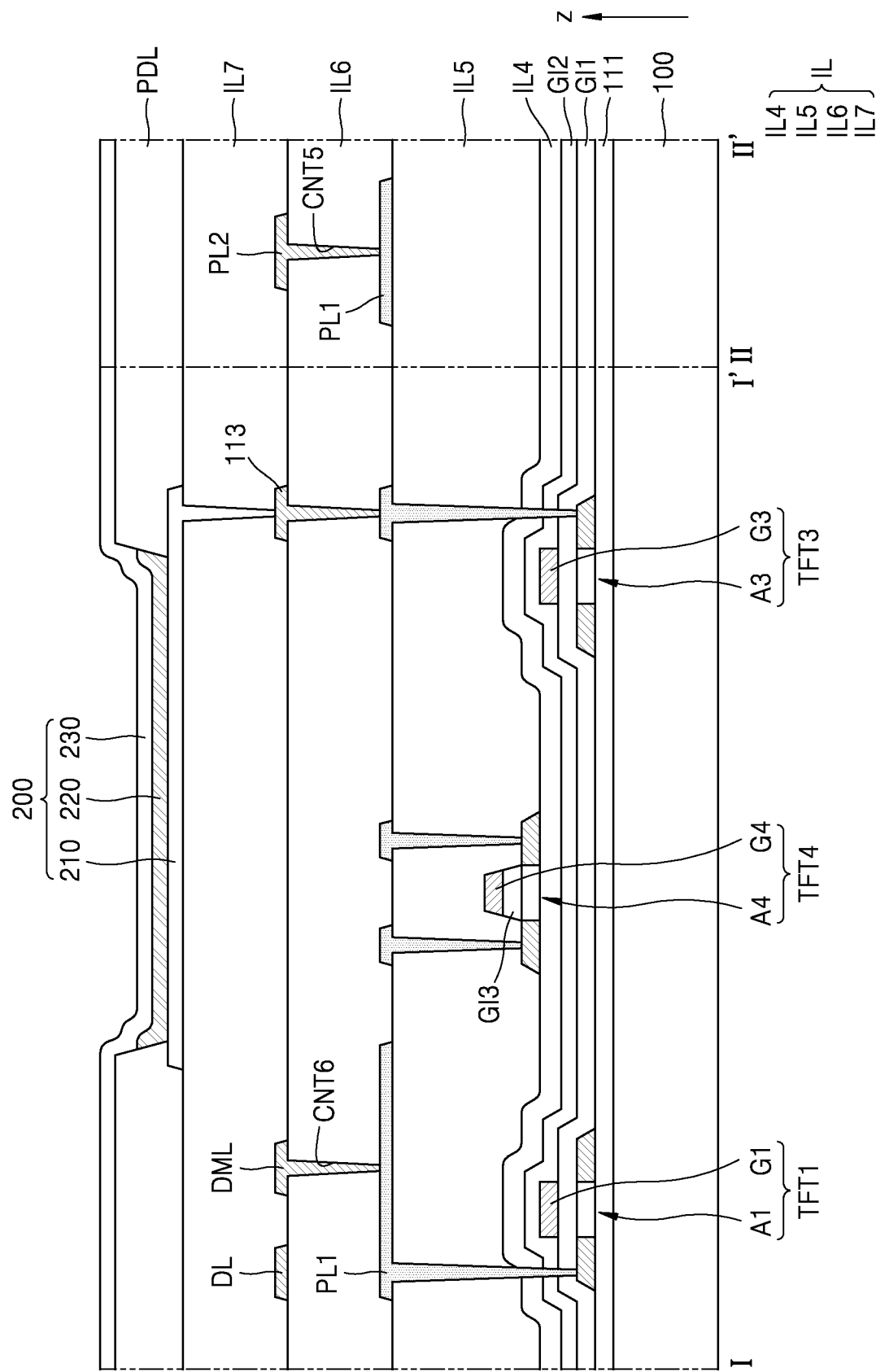

FIG. 8B is a cross-sectional view of the display panel taken along the line I-I' and the line II-II' of FIG. 7. In FIG. 8B, the same reference numerals as those in FIGS. 7 and 8A denote the same or substantially the same elements as those in FIGS. 7 and 8A, and thus, redundant descriptions thereof may not be repeated.

Referring to FIG. 8B, the display panel 10 (see FIG. 4) may include a first thin-film transistor TFT1, a third thin-film transistor TFT3, and a fourth thin-film transistor TFT4, which include semiconductor layers of different materials, unlike the first, second, and third thin-film transistors TFT1, TFT2, and TFT3 illustrated in FIG. 8A.

Hereinafter, display elements and various elements electrically connected to the display elements will be described in more detail with reference to FIG. 8B according to a stacking order.

A substrate 100 may include a glass material, a ceramic material, a metal material, or a material having flexible or bendable properties. A buffer layer 111 may be arranged on the substrate 100, and a barrier layer may be further included between the substrate 100 and the buffer layer 111.

First and third semiconductor layers A1 and A3 may be arranged on the buffer layer 111. Each of the first and third semiconductor layers A1 and A3 may include amorphous silicon or polysilicon.

A first gate insulating layer GI1 and a second gate insulating layer GI2 may be stacked and arranged on the substrate 100 to cover the first and third semiconductor layers A1 and A3. The first gate insulating layer GI1 and the second gate insulating layer GI2 may each include $SiO_2$, $SiN_x$, SiON, $Al_2O_3$, $TiO_2$, $Ta_2O_5$, $HfO_2$, $ZnO_2$, or the like.

A first gate electrode G1 may be arranged on the first gate insulating layer GI1 to at least partially overlap with the first semiconductor layer A1, and a third gate electrode G3 may be arranged on the first gate insulating layer GI1 to at least partially overlap with the third semiconductor layer A3. In FIG. 8B, the first and third gate electrodes G1 and G3 are arranged on the first gate insulating layer GI1. However, in another embodiment, the first and third gate electrodes G1 and G3 may be arranged on the upper surface of the second gate insulating layer GI2.

Fourth and fifth insulating layers IL4 and IL5 may be stacked and arranged on the second gate insulating layer GI2. Each of the fourth and fifth insulating layers IL4 and IL5 may include $SiO_2$, $SiN_x$, SiON, $Al_2O_3$, $TiO_2$, $Ta_2O_5$, $HfO_2$, $ZnO_2$, or the like.

A fourth semiconductor layer A4 may be arranged on the fourth insulating layer IL4. The fourth semiconductor layer A4 may include an oxide semiconductor material. The fourth semiconductor layer A4 may include, for example, an oxide of at least one material selected from the group consisting of In, Ga, Sn, Zr, V, Hf, Cd, Ge, Cr, Ti, Al, Cs, Ce, and Zn. For example, the fourth semiconductor layer A4 may be an InSnZnO (ITZO) semiconductor layer, an InGaZnO (IGZO) semiconductor layer, or the like.

A third gate insulating layer GI3 may be arranged on the fourth semiconductor layer A4. In an embodiment, as shown in FIG. 8B, the third gate insulating layer GI3 may be patterned to overlap with a portion of the fourth semiconductor layer A4. In another embodiment, the third gate insulating layer GI3 may not be patterned to overlap with a portion of the fourth semiconductor layer A4, but may be arranged on an entire surface of the substrate 100 to cover the fourth semiconductor layer A4.

A fourth gate electrode G4 may be arranged on the third gate insulating layer GI3 to at least partially overlap with the fourth semiconductor layer A4. The fourth gate electrode G4 may include a single layer or multiple layers including one or more metals selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A first voltage line PL1 may be arranged on the fifth insulating layer IL5. The first voltage line PL1 may be connected to the first semiconductor layer A1 through a contact hole defined in the first gate insulating layer GI1, the second gate insulating layer GI2, the fourth insulating layer IL4, and the fifth insulating layer IL5.

A sixth insulating layer IL6 and a seventh insulating layer IL7 may be stacked and arranged on the fifth insulating layer IL5 to cover the first voltage line PL1. Each of the sixth and seventh insulating layers IL6 and IL7 may include a single layer or multiple layers including an organic material, and may provide a flat or substantially flat top surface. Each of the sixth and seventh insulating layers IL6 and IL7 may include a commercial polymer, for example, such as BCB, HMDSO, PMMA or PS, a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like.

A data line DL, a dummy line DML, an electrode layer 113, and a second voltage line PL2 may be arranged on the sixth insulating layer IL6. The second voltage line PL2 may be connected to the first voltage line PL1 through a fifth contact hole CNT5 defined in the sixth insulating layer IL6. The dummy line DML may be connected to the first voltage line PL1 through a sixth contact hole CNT6 defined in the sixth insulating layer IL6. The electrode layer 113 may be connected to the third semiconductor layer A3 through a contact hole defined in the sixth insulating layer IL2.

A display element 200 may be arranged on the seventh insulating layer IL7. The display element 200 may include a pixel electrode 210, an intermediate layer 220, and an opposite electrode 230. Also, a pixel-defining layer PDL may be arranged on the seventh insulating layer IL7. The pixel-defining layer PDL may prevent or substantially prevent arcs from occurring at the edge of the pixel electrode 210 by increasing the distance between the edge of the pixel electrode 210 and the opposite electrode 230 above the pixel electrode 210.

Each of the first thin-film transistor TFT1, the third thin-film transistor TFT3, and the fourth thin-film transistor TFT4 shown in FIG. 8B may correspond to any one of the thin-film transistors of FIG. 7. For example, the first thin-film transistor TFT1 may be the first emission control thin-film transistor T5 connected to the driving voltage line PL, the third thin-film transistor TFT3 may be the second emission control thin-film transistor T6, and the fourth thin-film transistor TFT4 may be either the compensation thin-film transistor T3 or the gate initialization thin-film transistor T4. However, the present disclosure is not limited thereto, and the number and/or type of thin-film transistors shown along the line I-I' and the line II-II' of FIG. 7 may be variously modified.

In an embodiment, the dummy line DML may be connected to the first voltage line PL1 through the sixth contact hole CNT6. In this case, the dummy line DML may be connected to the first voltage line PL1 connected to a voltage supply line to receive a voltage. Therefore, it may be possible to prevent or substantially prevent the dummy line DML from being maintained in a floating state.

Figure 9:
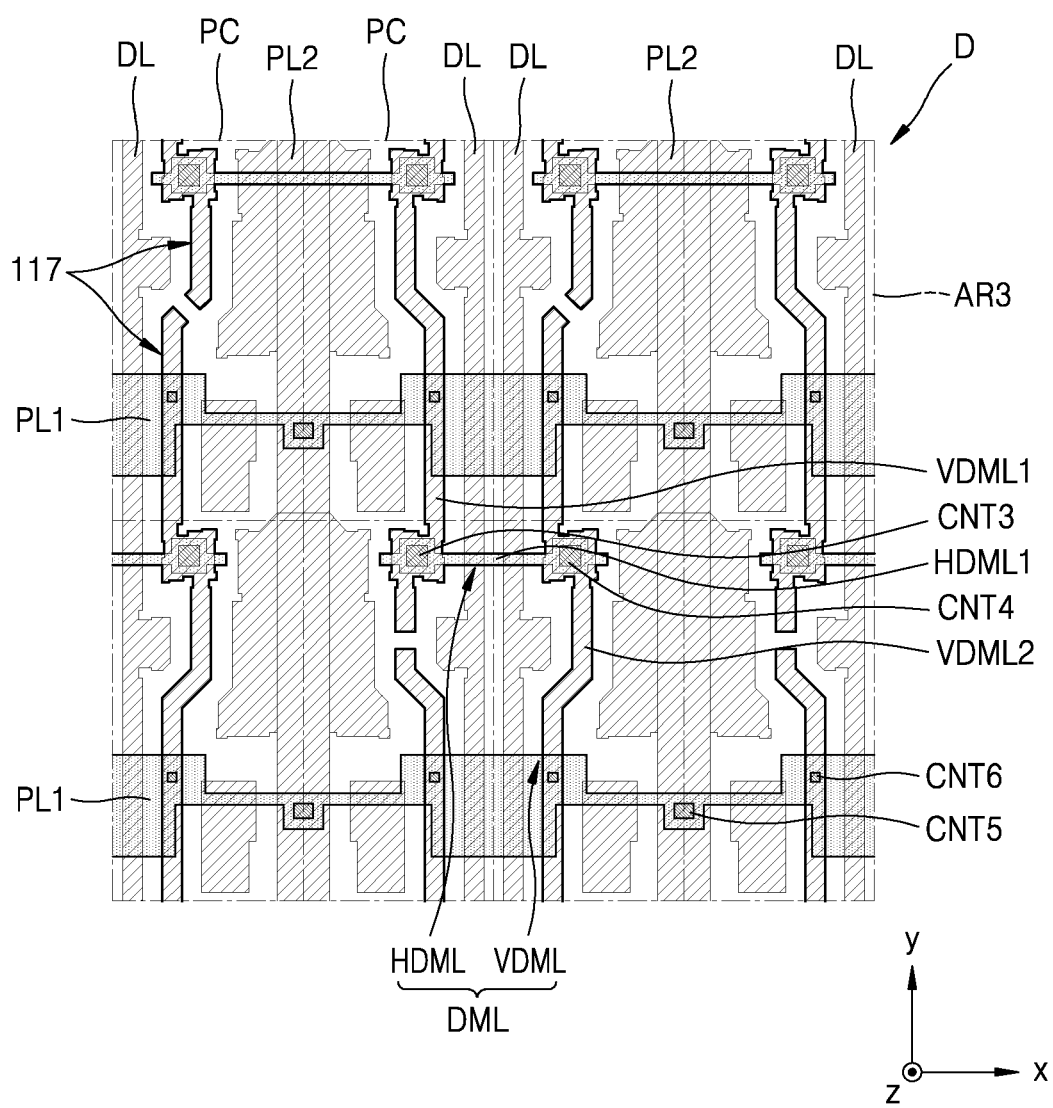
FIG. 9 is an enlarged plan view showing the portion D of FIG. 4.

FIG. 9 is an enlarged plan view showing the portion D of FIG. 4. In FIG. 9, the same reference numerals as those in FIG. 7 denote the same or substantially the same elements as those in FIG. 7, and thus, redundant descriptions thereof may not be repeated.

FIG. 9 is a partially enlarged view of the third area AR3 of the display area DA, and corresponds to some of the plurality of pixel circuits PC arranged in a plurality of rows and a plurality of columns. In addition, FIG. 9 partially illustrates some of a plurality of layers constituting a plurality of pixel circuits PC.

Referring to FIG. 9, the third area AR3 of the display area DA may include a plurality of pixel circuits PC, and each of the pixel circuits PC may include a data line DL, a dummy line DML, a first voltage line PL1, and a second voltage line PL2. In more detail, the third area AR3 of the display area DA corresponds to an area where a plurality of second data lines DL2 respectively connected to a plurality of connection lines CL partially overlaps with one another, as described above with reference to FIG. 1.

At (e.g., in or on) the third area AR3 of the display area DA, the data line DL may be located across the plurality of pixel circuits PC. The data line DL may extend in the first direction (e.g., the y direction).

At (e.g., in or on) the third area AR3 of the display area DA, the dummy line DML may be located across the plurality of pixel circuits PC.

The dummy line DML may have a shape that is bent at least twice, as shown in FIG. 9. The dummy line DML may include a plurality of horizontal dummy patterns HDML and a plurality of vertical dummy patterns VDML, which are alternately connected to one another. The plurality of horizontal dummy patterns HDML may be spaced apart from each other by at least one row interval. The plurality of vertical dummy patterns VDML may be spaced apart from each other by at least one column interval.

The plurality of horizontal dummy patterns HDML and the plurality of vertical dummy patterns VDML may be arranged on different layers from one another. For example, the plurality of vertical dummy patterns VDML may be arranged on the plurality of horizontal dummy patterns HDML, and the plurality of vertical dummy patterns VDML may be respectively connected to the plurality of horizontal dummy patterns HDML through a third contact hole CNT3 and a fourth contact hole CNT4 defined in an insulating layer IL.

One side of a first horizontal dummy pattern HDML1 that is one of the plurality of horizontal dummy patterns HDML may be connected to a first vertical dummy pattern VDML1 extending in the third direction (e.g., the +y direction) from among the plurality of vertical dummy patterns VDML, and the other side of the first horizontal dummy pattern HDML1 may be connected to a second vertical dummy pattern VDML2 extending in the fourth direction (e.g., the −y direction) from among the plurality of vertical dummy patterns VDML.

Each of the plurality of vertical dummy patterns VDML may include second branches 117 each protruding in the third direction (e.g., the +y direction) and/or the fourth direction (e.g., the −y direction).

The first voltage line PL1 may extend in the second direction (e.g., the x direction), and the second voltage line PL2 may extend in the first direction (e.g., the y direction) crossing the second direction. The first voltage line PL1 and the second voltage line PL2 may be arranged on different layers from each other, and the first voltage line PL1 and the second voltage line PL2 may be connected to each other through a fifth contact hole CNT5 defined in the insulating layer IL. As shown in FIG. 9, a plurality of first voltage lines PL1 and a plurality of second voltage lines PL2 may be provided. The plurality of first voltage lines PL1 and the plurality of second voltage lines PL2 may form a mesh structure.

The first voltage line PL1 and the second voltage line PL2 may be connected to a voltage supply line arranged at an upper end portion and/or a lower end portion of the display panel 10 to receive a voltage. For example, the voltage supplied to the first voltage line PL1 and the second voltage line PL2 may be the driving voltage ELVDD (e.g., see FIGS. 5 and 6).

The dummy line DML may be connected to at least one of the first voltage line PL1 and the second voltage line PL2. For example, as shown in FIG. 9, the dummy line DML may be connected to the first voltage line PL1 through a sixth contact hole CNT6 defined in the insulating layer IL.

As in the present embodiment, when the dummy line DML has a disconnected portion similar to the connection line CL, and has a shape that is bent at least twice (e.g., when the shape of the dummy line DML is the same or substantially the same as that of the connection line CL), there may be no difference in the amount of metal materials between the first area AR1 where the connection lines CL are arranged and the third area AR3 where the dummy lines DML are arranged. Therefore, in the non-driving state of the display panel, the visibility difference occurring between the first area AR1 where the connection lines CL are arranged and the third area AR3 where the dummy lines DML are arranged may be reduced.

In addition, the dummy line DML may be connected to at least one of the plurality of first voltage lines PL1 arranged in a plurality of rows. In this case, the dummy line DML may be connected to the first voltage line PL1 connected to a voltage supply line to receive a voltage. Therefore, it may be possible to prevent or substantially prevent the dummy line DML from being maintained in a floating state.

Figure 10:
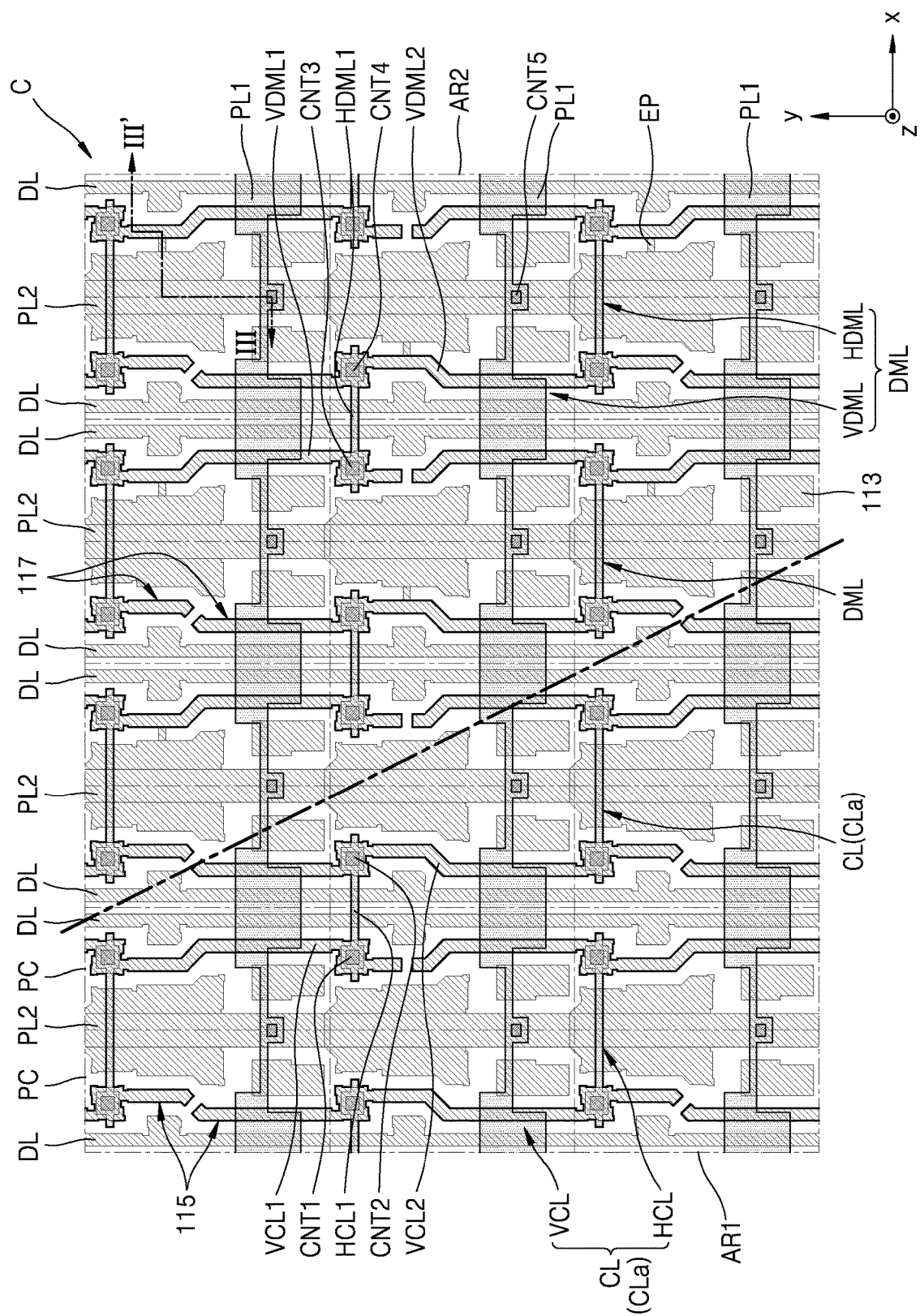
FIG. 10 is an enlarged plan view showing the portion C of FIG. 4.
Figure 11:
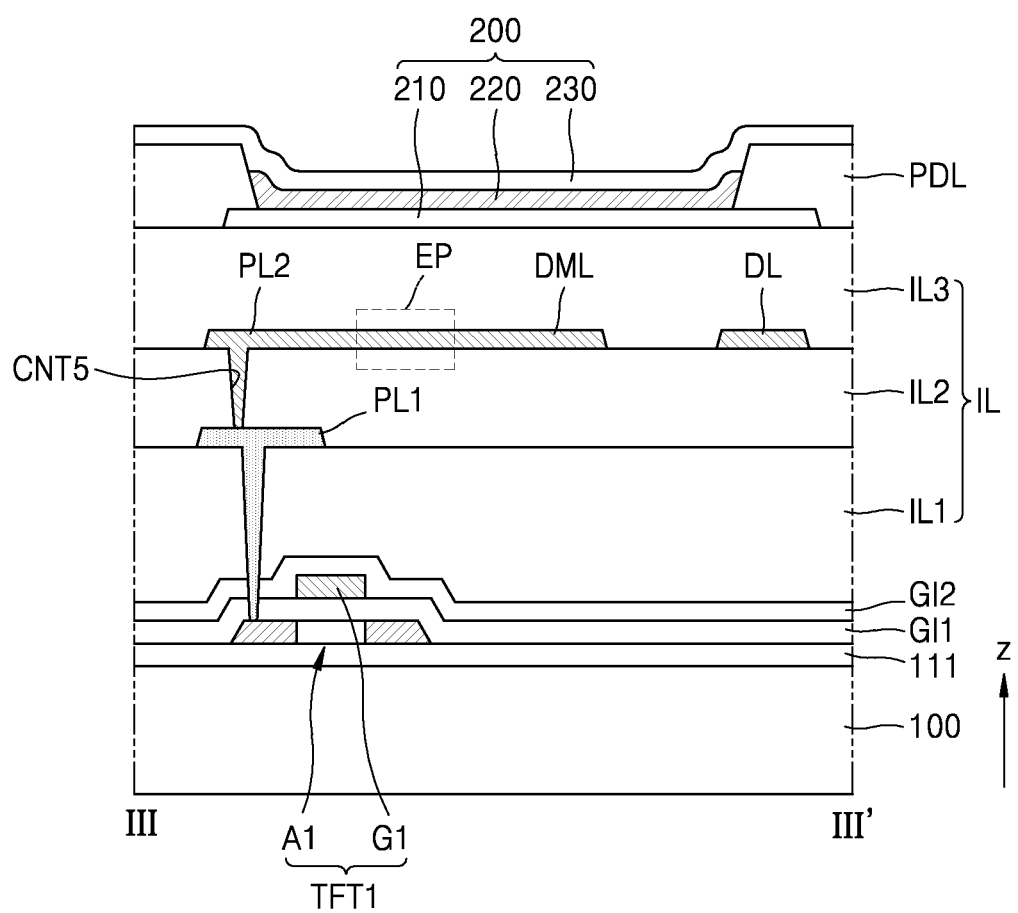
FIG. 11 is a cross-sectional view of a display panel taken along the line III-III' of FIG. 10.

FIG. 10 is an enlarged plan view showing the portion C of FIG. 4, and FIG. 11 is a cross-sectional view of the display panel taken along the line III-III' of FIG. 10. FIG. 10 corresponds to a modification of the embodiment of FIG. 7. In FIGS. 10 and 11, the same reference numerals as those in FIGS. 7 and 8A denote the same or substantially the same elements as those in FIGS. 7 and 8A, and thus, redundant descriptions thereof may not be repeated.

FIG. 10 is a partially enlarged view of the first area AR1 and the second area AR2 of the display area DA, and corresponds to some of a plurality of pixel circuits PC arranged in a plurality of rows and a plurality of columns.

Referring to FIG. 10, the display panel 10 (e.g., see FIG. 4) may include a plurality of pixel circuits PC, and each of the pixel circuits PC may include a data line DL, a connection line CL, a dummy line DML, a first voltage line PL1, and a second voltage line PL2.

Each of the plurality of pixel circuits PC may include either the pixel circuit PC of FIG. 5 or the pixel circuit PC of FIG. 6. In an embodiment, as shown in FIG. 10, the pixel circuit PC may be arranged to form a symmetrical or substantially symmetrical shape with a pixel circuit PC adjacent thereto. As another example, a plurality of pixel circuits PC arranged in a plurality of rows and a plurality of columns may have the same or substantially the same shape as each other.

At (e.g., in or on) the first area AR1 and the second area AR2 of the display area DA, the data line DL may be located across the plurality of pixel circuits PC. The data line DL may extend in the first direction (e.g., the y direction).

At (e.g., in or on) the first area AR1 of the display area DA, the connection line CL may be located across the plurality of pixel circuits PC. At (e.g., in or on) the second area AR2 of the display area DA, the dummy line DML may be located across the plurality of pixel circuits PC.

The connection line CL and the dummy line DML may each have a shape that is bent at least twice, as shown in FIG. 10. The connection line CL may include a plurality of horizontal connection patterns HCL and a plurality of vertical connection patterns VCL, which are alternately connected to one another, and the dummy line DML may include a plurality of horizontal dummy patterns HDML and a plurality of vertical dummy patterns VDML, which are alternately connected to one another.

Each of the plurality of vertical connection patterns VCL may include first branches 115, each protruding in the third direction (e.g., the +y direction) and/or the fourth direction (e.g., the −y direction). Each of the plurality of vertical dummy patterns VDML may include second branches 117, each protruding in the third direction (e.g., the +y direction) and/or the fourth direction (e.g., the −y direction).

The first voltage line PL1 may extend in the second direction (e.g., the x direction), and the second voltage line PL2 may extend in the first direction (e.g., the y direction) crossing the second direction. A plurality of first voltage lines PL1 and a plurality of second voltage lines PL2 may be provided, and may form a mesh structure.

The first voltage line PL1 and the second voltage line PL2 may be connected to a voltage supply line arranged at an upper end portion and/or a lower end portion of the display panel 10 to receive a voltage. For example, the voltage supplied to the first voltage line PL1 and the second voltage line PL2 may be the driving voltage ELVDD (e.g., see FIGS. 5 and 6).

The dummy line DML may be connected to at least one of the first voltage line PL1 and the second voltage line PL2. For example, as shown in FIG. 10, the dummy line DML may be connected to the second voltage line PL2 through an extension line EP.

The extension line EP may be a portion of the dummy line DML, and may extend from the dummy line DML to the second voltage line PL2. As another example, the extension line EP may be a portion of the second voltage line PL2, and may extend from the second voltage line PL2 to the dummy line DML.

As in the present embodiment, when the dummy line DML has a disconnected portion similar to the connection line CL, and has a shape that is bent at least twice (e.g., when the shape of the dummy line DML is the same or substantially the same as that of the connection line CL), there may be no difference in the amount of metal materials between the first area AR1 where the connection lines CL are arranged and the second area AR2 where the dummy lines DML are arranged. Therefore, in the non-driving state of the display panel, the visibility difference that may occur between the first area AR1 where the connection lines CL are arranged and the second area AR2 where the dummy lines DML are arranged may be reduced.

In addition, the dummy line DML may be connected to at least one of a plurality of second voltage lines PL2 arranged in a plurality of rows. In this case, the dummy line DML may be connected to the second voltage line PL2 connected to a voltage supply line to receive a voltage. Therefore, it may be possible to prevent or substantially prevent the dummy line DML from being maintained in a floating state.

The dummy lines DML may be connected to the second voltage line PL2 through at least two extension lines EP that are spaced apart from each other. In this case, the overall resistance of a supply network due to a voltage drop of the driving voltage ELVDD supplied to the first voltage line PL1 and the second voltage line PL2 arranged in a mesh structure may be reduced.

Hereinafter, a position relationship between the dummy line DML and the first and second voltage lines PL1 and PL2 will be described in more detail with reference to FIG. 11.

The substrate 100 may include glass or polymer resin. A buffer layer 111 may be arranged on the substrate 100, and may reduce or block the penetration of foreign materials, moisture, and/or external air from the bottom of the substrate 100. The buffer layer 111 may provide a flat or substantially flat surface on the substrate 100. A barrier layer may be further included between the substrate 100 and the buffer layer 111.

A first semiconductor layer A1 may be arranged on the buffer layer 111. The first semiconductor layer A1 may include a channel region, and a source region and a drain region arranged at opposite sides (e.g., both sides) of the channel region. The first semiconductor layer A1 may include a single layer or multiple layers.

A first gate insulating layer GI1 and a second gate insulating layer GI2 may be stacked and arranged on the substrate 100 to cover the first semiconductor layer A1. A first gate electrode G1 may be arranged on the first gate insulating layer GI1 to at least partially overlap with the first semiconductor layer A1.

First to third insulating layers IL4 and IL5 may be stacked and arranged on the second gate insulating layer GI2.

The first voltage line PL1 may be arranged on the first insulating layer IL1. The first voltage line PL1 may include a conductive material including Mo, Al, Cu, Ti, or the like, and may include multiple layers or a single layer including one or more of the aforementioned materials. For example, the first voltage line PL1 may have a multi-layered structure of Ti/Al/Ti. The first voltage line PL1 may be connected to the first semiconductor layer A1 through a contact hole defined in the first insulating layer IL1.

A data line DL, a dummy line DML, and a second voltage line PL2 may be arranged on the second insulating layer IL2. The second voltage line PL2 may be connected to the first voltage line PL1 through a fifth contact hole CNT5 defined in the second insulating layer IL2. The dummy line DML may include an extension line EP extending toward the second voltage line PL2, and may be connected to the second voltage line PL2 through the extension line EP.

A display element 200 may be arranged on the third insulating layer IL3. The display element 200 may include a pixel electrode 210, an intermediate layer 220 including an organic emission layer, and an opposite electrode 230. At (e.g., in or on) the display area DA of the substrate 100, a pixel-defining layer PDL may be arranged on the third insulating layer IL3. In addition, the pixel-defining layer PDL may prevent or substantially prevent arcs from occurring at the edge of the pixel electrode 210 by increasing the distance between the edge of the pixel electrode 210 and the opposite electrode 230 above the pixel electrode 210.

Figure 12:
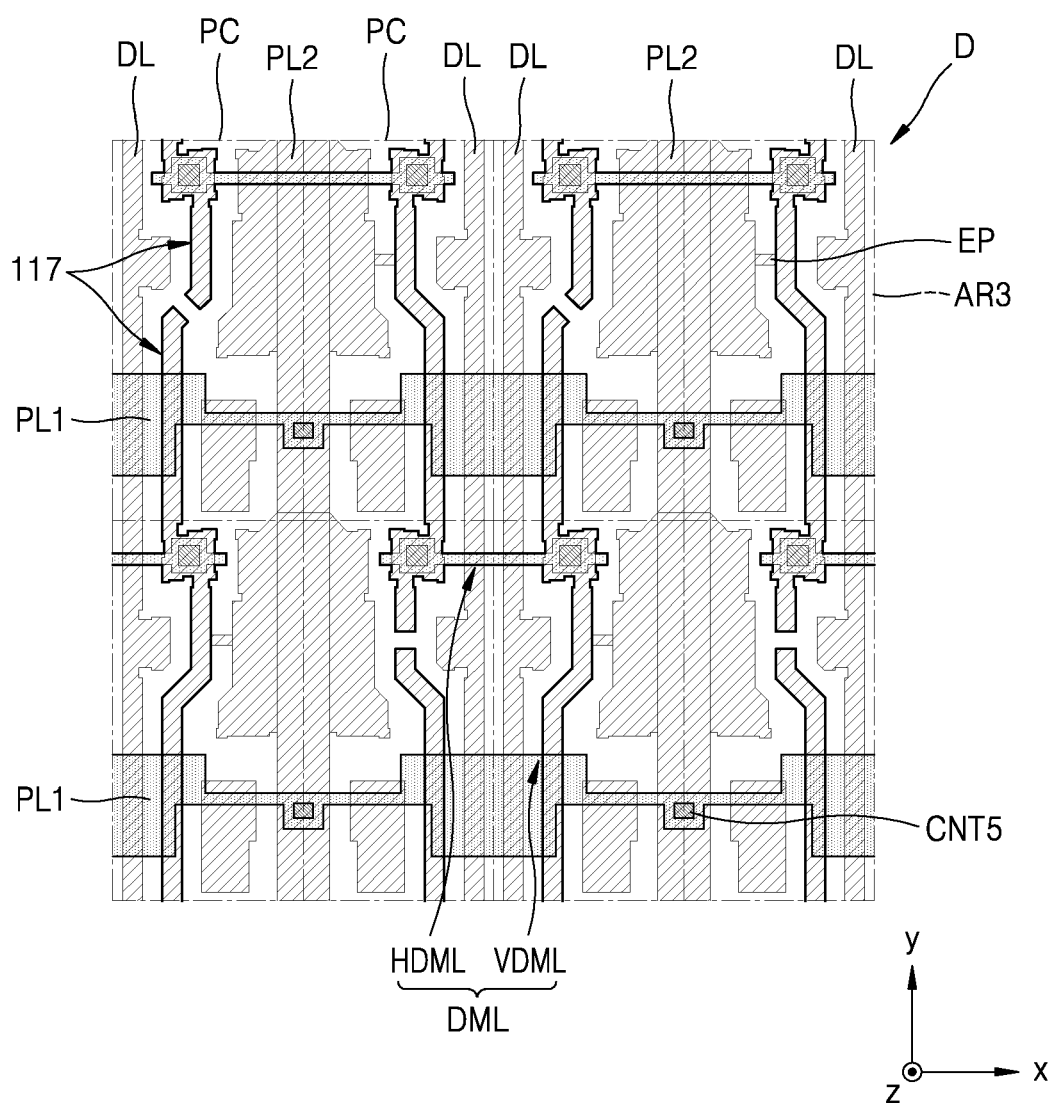
FIG. 12 is an enlarged plan view showing the portion D of FIG. 4.

FIG. 12 is an enlarged plan view showing the portion D of FIG. 4. In FIG. 12, the same reference numerals as those in FIG. 7 denote the same or substantially the same elements as those in FIG. 7, and thus, redundant descriptions thereof may not be repeated.

FIG. 12 is a partially enlarged view of the third area AR3 of the display area DA, and corresponds to some of the plurality of pixel circuits PC arranged in a plurality of rows and a plurality of columns. In addition, FIG. 12 partially illustrates some of a plurality of layers constituting a plurality of pixel circuits PC.

Referring to FIG. 12, the third area AR3 of the display area DA may include a plurality of pixel circuits PC, and each of the pixel circuits PC may include a data line DL, a dummy line DML, a first voltage line PL1, and a second voltage line PL2. In more detail, the third area AR3 of the display area DA corresponds to an area where a plurality of second data lines DL2 respectively connected to a plurality of connection lines CL partially overlap with one another, as described above with reference to FIG. 1.

At (e.g., in or on) the third area AR3 of the display area DA, the data line DL may be located across the plurality of pixel circuits PC, and the dummy line DML may be located across the plurality of pixel circuits PC.

Each of the plurality of dummy lines DML may have a shape that is bent at least twice, as shown in FIG. 12. Each of the plurality of dummy lines DML may include a plurality of horizontal dummy patterns HDML and a plurality of vertical dummy patterns VDML, which are alternately connected to one another. The plurality of horizontal dummy patterns HDML may be spaced apart from each other by at least one row interval. The plurality of vertical dummy patterns VDML may be spaced apart from each other by at least one column interval. Each of the plurality of vertical dummy patterns VDML may include second branches 117 each protruding in the third direction (e.g., the +y direction) and/or the fourth direction (e.g., the −y direction).

The first voltage line PL1 may extend in the second direction (e.g., the x direction), and the second voltage line PL2 may extend in the first direction (e.g., the y direction) crossing the second direction. The first voltage line PL1 and the second voltage line PL2 may be arranged on different layers from each other, and the first voltage line PL1 and the second voltage line PL2 may be connected to each other through a fifth contact hole CNT5 defined in an insulating layer IL. As shown in FIG. 12, a plurality of first voltage lines PL1 and a plurality of second voltage lines PL2 may be provided. The plurality of first voltage lines PL1 and the plurality of second voltage lines PL2 may form a mesh structure.

The first voltage line PL1 and the second voltage line PL2 may be connected to a voltage supply line arranged at an upper end portion and/or a lower end portion of the display panel 10 to receive a voltage. For example, the voltage supplied to the first voltage line PL1 and the second voltage line PL2 may be the driving voltage ELVDD (e.g., see FIGS. 5 and 6).

The dummy line DML may be connected to at least one of the first voltage line PL1 and the second voltage line PL2. For example, as shown in FIG. 12, the dummy line DML may be connected to the second voltage line PL2 through an extension line EP.

The extension line EP may be a portion of the dummy line DML, and may extend from the dummy line DML to the second voltage line PL2. As another example, the extension line EP may be a portion of the second voltage line PL2, and may extend from the second voltage line PL2 to the dummy line DML.

As in the present embodiment, when the dummy line DML has a disconnected portion similar to the connection line CL, and has a shape that is bent at least twice (e.g., when the shape of the dummy line DML is the same or substantially the same as that of the connection line CL), there may be no difference in the amount of metal materials between the first area AR1 where the connection lines CL are arranged and the third area AR3 where the dummy lines DML are arranged. Therefore, in the non-driving state of the display panel, the visibility difference that may occur between the first area AR1 where the connection lines CL are arranged and the third area AR3 where the dummy lines DML are arranged may be reduced.

In addition, the dummy line DML may be connected to at least one of a plurality of second voltage lines PL2 arranged in a plurality of rows. In this case, the dummy line DML may be connected to the second voltage line PL2 connected to a voltage supply line to receive a voltage. Therefore, it may be possible to prevent or substantially prevent the dummy line DML from being maintained in a floating state.

The dummy lines DML may be connected to the second voltage line PL2 through at least two extension lines EP that are spaced apart from each other. In this case, the overall resistance of a supply network due to a voltage drop of the driving voltage ELVDD supplied to the first voltage line PL1 and the second voltage line PL2 arranged in a mesh structure may be reduced.

While a structure of the display device has been mainly described, the present disclosure is not limited thereto. For example, it will be understood to a person having ordinary skill in the present arts that a method of manufacturing the display device may also fall within the scope of the present disclosure.

According to one or more embodiments of the present disclosure, as a connection line for transmitting a data signal to a data line is arranged at (e.g., in or on) a display area, a dead space of the display device may be reduced. In addition, because a dummy line other than the connection line has the same or substantially the same shape as that of the connection line, the visibility difference that may occur between an area where the connection line is arranged and an area where the dummy line is arranged may be reduced. However, the spirit and scope of the present disclosure is not limited by these aspects and features.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display device comprising:
    a substrate comprising a display area, and a peripheral area outside the display area, the display area comprising a first area and a second area;

a data line at the display area;
a pad area at the peripheral area;
a connection line at the first area, and connected to the data line to transmit a data signal supplied from the pad area to the data line; and
a dummy line at the second area, the dummy line comprising a plurality of horizontal dummy patterns and a plurality of vertical dummy patterns that are alternately connected to one another.

2. The display device of claim 1, wherein the plurality of horizontal dummy patterns and the plurality of vertical dummy patterns are at different layers from one another.

3. The display device of claim 1, wherein the connection line comprises a plurality of horizontal connection patterns and a plurality of vertical connection patterns that are alternately connected to one another.

4. The display device of claim 3, wherein one side of a first horizontal connection pattern from among the plurality of horizontal connection patterns is connected to a first vertical connection pattern extending in a first direction from among the plurality of vertical connection patterns, and another side of the first horizontal connection pattern is connected to a second vertical connection pattern extending in a second direction opposite to the first direction from among the plurality of vertical connection patterns.

5. The display device of claim 3, wherein the plurality of horizontal connection patterns and the plurality of vertical connection patterns are at different layers from one another.

6. The display device of claim 3, wherein the plurality of horizontal dummy patterns and the plurality of horizontal connection patterns are at a same layer as each other, and
the plurality of vertical dummy patterns and the plurality of vertical connection patterns are at a same layer as each other.

7. The display device of claim 1, further comprising a voltage line on the substrate,
wherein the dummy line is connected to the voltage line.

8. The display device of claim 7, wherein the voltage line comprises a first voltage line, and a second voltage line crossing the first voltage line, and
the dummy line is connected to at least one of the first voltage line or the second voltage line.

9. The display device of claim 8, wherein the first voltage line and the second voltage line are at different layers from each other.

10. The display device of claim 8, further comprising an insulating layer between the dummy line and the first voltage line,
wherein the dummy line is connected to the first voltage line through a contact hole defined in the insulating layer.

11. The display device of claim 8, wherein the dummy line comprises an extension line extending toward the second voltage line and contacting the second voltage line.

12. The display device of claim 7, wherein the dummy line is connected to the voltage line through at least two contact holes that are spaced from each other.

13. The display device of claim 7, further comprising a first thin-film transistor comprising a first semiconductor layer, and a first gate electrode at least partially overlapping with the first semiconductor layer,
wherein the voltage line is electrically connected to the first thin-film transistor.

14. The display device of claim 13, further comprising a second thin-film transistor comprising a second semiconductor layer, and a second gate electrode at least partially overlapping the second semiconductor layer,
wherein the second semiconductor layer comprises a material different from the first semiconductor layer.

15. A display device comprising:
a substrate comprising a display area, and a peripheral area outside the display area, the display area comprising a first area and a second area;
a data line at the display area;
a pad area at the peripheral area;
a connection line at the first area, and connected to the data line to transmit a data signal supplied from the pad area to the data line, the connection line comprising a plurality of horizontal connection patterns and a plurality of vertical connection patterns that are alternately connected to one another; and
a dummy line at the second area to which a predetermined voltage is applied.

16. The display device of claim 15, wherein the plurality of horizontal connection patterns and the plurality of vertical connection patterns are at different layers from one another.

17. The display device of claim 15, wherein the dummy line has a shape that is bent at least twice in a plan view.

18. The display device of claim 15, wherein the dummy line comprises a plurality of horizontal dummy patterns and a plurality of vertical dummy patterns that are alternately connected to one another.

19. The display device of claim 15, further comprising a voltage line on the substrate to which the predetermined voltage is applied; and
an insulating layer between the dummy line and the voltage line,
wherein the dummy line is connected to the voltage line through a contact hole defined in the insulating layer.

20. The display device of claim 15, further comprising a voltage line on the substrate to which the predetermined voltage is applied,
wherein the dummy line comprises an extension line extending toward the voltage line, and contacting the voltage line.

* * * * *